US007360191B2

(12) United States Patent
Chang et al.

(10) Patent No.: US 7,360,191 B2
(45) Date of Patent: Apr. 15, 2008

(54) DELTA INFORMATION DESIGN CLOSURE INTEGRATED CIRCUIT FABRICATION

(75) Inventors: Li-Fu Chang, Sunnyvale, CA (US); Yao-Ting Wang, Sunnyvale, CA (US); Fang-Cheng Chang, Sunnyvale, CA (US)

(73) Assignee: Clear Shape Technologies, Inc., Sunnyvale, CA (US)

( * ) Notice: Subject to any disclaimer, the term of this patent is extended or adjusted under 35 U.S.C. 154(b) by 257 days.

(21) Appl. No.: 10/984,210

(22) Filed: Nov. 8, 2004

(65) Prior Publication Data

US 2005/0108666 A1 May 19, 2005

Related U.S. Application Data

(60) Provisional application No. 60/517,648, filed on Nov. 6, 2003, provisional application No. 60/517,664, filed on Nov. 6, 2003, provisional application No. 60/559,267, filed on Apr. 2, 2004.

(51) Int. Cl.
*G06F 17/50* (2006.01)
(52) U.S. Cl. .................................. 716/6; 716/2; 716/5
(58) Field of Classification Search .................... 716/2, 716/4–6, 18
See application file for complete search history.

(56) References Cited

U.S. PATENT DOCUMENTS

| | | | |
|---|---|---|---|
| 4,827,428 | A | 5/1989 | Dunlop et al. |
| 4,904,569 | A | 2/1990 | Fukuda et al. |
| 5,293,216 | A | 3/1994 | Moslehi et al. |
| 5,764,532 | A | 6/1998 | Patel |
| 5,974,244 | A | 10/1999 | Hayashi et al. |
| 6,014,505 | A | 1/2000 | Schorn |
| 6,169,968 | B1 | 1/2001 | Kabuo |

(Continued)

FOREIGN PATENT DOCUMENTS

JP        05198678        8/1993

(Continued)

OTHER PUBLICATIONS

Acar, E. et al., "A Linear-Centric Simulation Framework for Parametric Fluctions", 2002 Proceedings of Design, Automation and Test in Europe Conference and Exhibition, Mar. 4, 2002, pp. 1-8.

(Continued)

*Primary Examiner*—Paul Dinh
(74) *Attorney, Agent, or Firm*—Sheppard Mullin Richter & Hampton LLP

(57) ABSTRACT

Systems and methods for timing-driven shape closure in integrated circuit ("IC") fabrication are provided. These Integrated Design-Manufacturing Processes ("IDMP") include a delta flow that integrates information of the IC fabrication timing and geometry verification processes into the IC design. The delta flow is an incremental flow that includes delta-geometry timing prediction processes and/or delta-timing shape prediction processes for processing difference information associated with circuit characterization parameters. The delta flow independently re-characterizes an IC design using the difference or delta information corresponding to the circuit characterization parameters. The delta flow provides delta outputs (incremental) that enhance or re-characterize corresponding parameters of the devices and interconnect structures without the need to generate new circuit characterization parameters and without the need to re-process all information of the IC design.

37 Claims, 16 Drawing Sheets

U.S. PATENT DOCUMENTS

| | | |
|---|---|---|
| 6,209,121 B1 | 3/2001 | Goto |
| 6,209,122 B1 | 3/2001 | Jyu et al. |
| 6,219,631 B1 | 4/2001 | Oh et al. |
| 6,306,769 B1 | 10/2001 | Subramanian et al. |
| 6,378,109 B1 | 4/2002 | Young et al. |
| 6,425,110 B1 | 7/2002 | Hathaway et al. |
| 6,507,936 B2 | 1/2003 | Yamaguchi |
| 6,553,338 B1 | 4/2003 | Buch et al. |
| 6,618,837 B1 | 9/2003 | Zhang et al. |
| 6,990,651 B2 | 1/2006 | Balasubramanian et al. |
| 2002/0196629 A1 | 12/2002 | Terashi |
| 2003/0167451 A1 | 9/2003 | Igarashi |
| 2003/0229412 A1 | 12/2003 | White et al. |
| 2003/0229868 A1 * | 12/2003 | White et al. .................. 716/5 |
| 2004/0010764 A1 | 1/2004 | Zhang et al. |
| 2004/0052411 A1 | 3/2004 | Qian et al. |
| 2004/0170905 A1 | 9/2004 | Liebmann et al. |
| 2004/0172609 A1 | 9/2004 | Hassibi et al. |
| 2004/0210863 A1 | 10/2004 | Culp et al. |
| 2004/0243964 A1 | 12/2004 | McElvain et al. |
| 2005/0027501 A1 | 2/2005 | Chen et al. |
| 2005/0034087 A1 | 2/2005 | Hamlin et al. |
| 2005/0108666 A1 | 5/2005 | Chang et al. |
| 2005/0172251 A1 | 8/2005 | Chang et al. |
| 2006/0015834 A1 | 1/2006 | Amekawa |

FOREIGN PATENT DOCUMENTS

| | | |
|---|---|---|
| JP | 06149925 | 5/1994 |
| JP | 07056976 | 3/1995 |
| JP | 09006831 | 1/1997 |
| JP | 2003076737 | 3/2003 |

OTHER PUBLICATIONS

Anne, P. et al., "Comparative Analysis of New CMOS Leaf Cells for OTC Routing", IEEE International Symposium on Circuits and Systems, May 30, 1994, vol. 4, pp. 191-194.

Dai, W. et al., "Timing Analysis Taking into Account Interconnect Process Variation", IEEE International Workshop on Statistical Methodology, Jun. 10, 2001, pp. 51-53.

Xue, T. et al., "Sensitivity-Based Wiresizing Approach to Interconnect Optimization of Lossy Transmission Line Topologies", 1996 IEEE Multi-Chip Module Conference, Feb. 6, 1996, pp. 117-122.

* cited by examiner

⟵ 900

| | |
|---|---|
| Power supply voltage | Vdd: 1.0V |
| Effective channel length | Leff: 90nm + $\Delta$d |
| Gate oxide thickness: | gox: 15A |
| Threshold voltage | Von: +/− 0.2V |
| Source/drain resistance | Rsd: n: 1000 Ohm-$\mu$m; |
| | p: 2000 Ohm-$\mu$m |
| Device widths: | Wn: 1$\mu$m; Wp: 3$\mu$m |
| nMOS switching resistance | WnRswn: 2800 Ohm-$\mu$m |
| pMOS switching resistance | WpRswp: 5800 Ohm-$\mu$m |
| Input capacitance | Cin/(Wn+Wp): 2.6 fF/$\mu$m + $\Delta$dCox |
| Output capacitance | Cout/(Wn+Wp): 1.6 fF/$\mu$m + $\Delta$dCox |

FIG.9

DELTA INFORMATION DESIGN CLOSURE INTEGRATED CIRCUIT FABRICATION

RELATED APPLICATION

This application claims the benefit of U. S. provisional Patent Application Ser. Nos. 60/517,648, filed Nov. 6, 2003, 60/517,664, filed Nov. 6, 2003, and 60/559,267, filed Apr. 2, 2004, all of which are currently pending.

TECHNICAL FIELD

The disclosure herein relates generally to fabricating integrated circuits. In particular, this disclosure relates to systems and methods for manufacturing integrated circuit devices or chips.

BACKGROUND

The design and manufacture of highly complex electronic circuits, referred to as very-large-scale integrated ("VLSI") circuits involves many stages. A typical System-on-Chip ("SoC") or chip design begins with the broad characteristics of each circuit of the SoC in terms of inputs and outputs. This broad conceptual design is then refined into an architectural design that shows the major functional units of each circuit and the interactions between these units. Each unit is then designed at a more detailed but still abstract level, typically using logic gates that perform the functions as appropriate to the design. The logic gate specification is then converted into an integrated-circuit ("IC") layout that is subsequently used to manufacture the chip. Following design, the IC layout is passed to manufacturing for use in producing chips.

Between the design and the manufacturing specification are the analysis and synthesis tools that ensure correct functioning of the chip manufactured from the IC design. The analysis tools are used to detect local layout errors such as design-rule violations, and more global design errors such as logical failures, short-circuits, and power inadequacies, for example. One fundamental analysis technique used by designers involves analysis of the signal timing associated with the IC layout.

Timing constraints typically demand that each transistor of an IC design switch correctly within finite pre-specified time windows, where the finite time windows are pre-partitioned based on the delays of each component in the circuit. The sub-100 nanometer ("nm") SoC designs running at 1 gigahertz ("GHz") or faster clock speeds, for example, require a transistor to complete a switching event of approximately 100 picoseconds in length during a timing window of only a few hundred picoseconds. As such, the high-speed associated with typical SoC designs has narrowed the timing windows to extremely small windows.

The small timing windows are very sensitive to the physical dimensions of the devices and the corresponding interconnects, especially in sub-100 nm SoC designs. Consequently, changes to critical physical dimensions of the fabricated circuits introduced into the circuits by the manufacturing process adversely affect the timing windows. As an example, resolution enhancement techniques ("RET") performed as part of the manufacturing process induces significantly longer transistor switching times because it induces deviations of the poly gate lengths from the designed sizes. Another example is associated with Chemical Mechanical Polishing ("CMP"), which also induces significantly longer wire delay times as a result of dishing effects produced on dense interconnects. Thus, most if not all reported device and interconnect designs adopted in SoC products have noted deviations in physical dimensions as a result of the current design and manufacturing process flow, with many of the deviations being severe.

The design and manufacturing process of chips is expected, however, to ensure delivery of low cost chips through high yield fabrication processes in spite of the issues associated with design deviations introduced during the process. However, the timing issues described above force the circuit designers and manufacturing engineers to sacrifice these criteria and over-design the chips in order to guard band timing constraints. For example, additional buffers are often inserted in the middle of "critical paths" by designers to improve negative slack times. These over-designs complicate the circuit description database, which in turn increases fabrication costs, increases the size of chip areas on a wafer, and reduces chip yield.

A primary cause of the failure of the chip manufacturing process to meet the above-stated objectives relates to a gap in the infrastructure of the semiconductor industry's typical design-manufacture flow. In essence, the timing verification, which is performed during the design stage before tape-out, and the geometry verification, which is performed after tape-out, are each performed in isolation and without any cross-referencing. Therefore, the transistor models and circuit netlists used in the timing analysis or verification are not a part of the documentation provided to the manufacturing process. Likewise, the final silicon images printed on the wafers are not provided to the designers in abstract model formats. Consequently, there is a need for an integrated design-manufacturing process that bridges the gap between design and manufacturing by incorporating the results of both timing and geometry analyses/verifications into the IC design process.

BRIEF DESCRIPTION OF THE DRAWINGS

FIG. 9 shows example parameters of a modified device model transistor, under an embodiment.

Figure 1A:
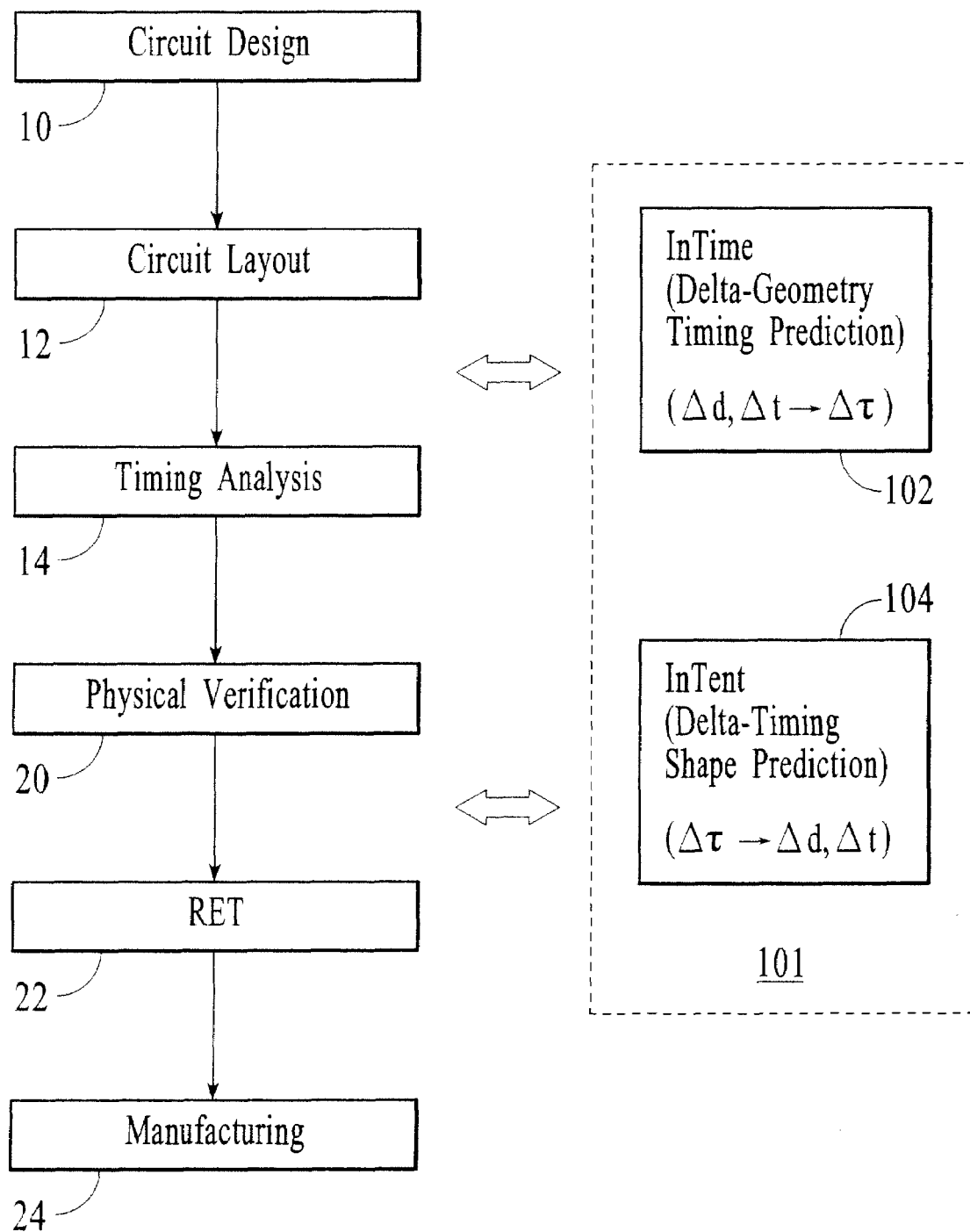
FIG. 1A is a block diagram of an Integrated Design-Manufacturing Process ("IDMP") 100A comprising a delta flow that includes delta-geometry timing prediction processes 102 and/or delta-timing shape prediction processes 104, under and embodiment.

In the drawings, the same reference numbers identify identical or substantially similar elements or acts. To easily identify the discussion of any particular element or act, the most significant digit or digits in a reference number refer to the Figure number in which that element is first introduced (e.g., element 102 is first introduced and discussed with respect to FIG. 1).

DETAILED DESCRIPTION

An integrated design-manufacturing process that includes systems and methods for timing-driven shape closure in integrated circuit ("IC") fabrication is described below. The systems and methods for fabricating ICs, also referred to herein as the Integrated Design-Manufacturing Processes ("IDMP"), integrate information of both the timing and geometry verification processes of IC fabrication into the IC design using a delta flow that includes delta-geometry timing prediction processes and delta-timing shape prediction processes.

FIG. 1A is a block diagram of an Integrated Design-Manufacturing Process ("IDMP") 100A comprising a delta flow 101 that includes delta-geometry timing prediction processes 102 and/or delta-timing shape prediction processes 104, under and embodiment. The delta flow 101 of an embodiment includes the delta-geometry timing prediction processes 102 and/or the delta-timing shape prediction processes 104 operating alone or in any combination. The IDMP 100A integrates timing and geometry constraints of an IC design into the design process by integrating dimensional variation information from geometry verification processes (manufacturing stage) with circuit models to form enhanced circuit models. The IDMP 100A uses the enhanced circuit models to generate a simulated model of the IC design or subparts of the IC design. The simulated model is used in timing verification processes (design stage) to generate timing variation information corresponding to the model. The IDMP 100A of an embodiment uses the timing variation information to produce dimensional variation rules for use in generating the simulated models of the IC design.

The IDMP 100A of an embodiment provides a "delta flow" 101 for use in IC design processes. The delta flow, 101 operates to use and generate delta or difference information corresponding to parameters that characterize the IC design. The delta flow 101, operating alone or in conjunction with other processes of an IC design-manufacturing system, provides delta outputs that enhance or re-characterize corresponding parameters of the devices and interconnect structures. The delta outputs are also referred to herein as "delta-enhanced parametric information", "delta-enhanced parameters", or "delta information". The delta-enhanced parametric information output by the delta flow 101 can be introduced into typical IC design processes of electronic design automation ("EDA") systems for example.

The delta-enhanced parametric information of an embodiment comes in numerous forms as appropriate to an IC design flow. As an example, separate reports that include the delta information of corresponding parameters may be provided. The delta-enhanced parametric information also may include modified or re-characterized information of libraries and/or models used in the IC design process. Modification or re-characterization of the libraries and/or models can include linking or appending the delta-enhanced parametric information to one or more netlists (e.g., SPICE netlist) or models (e.g., Berkeley short-channel IGFET model ("BSIM")). Modification or re-characterization of the libraries can also include replacing information of one or more netlists with new information that includes the delta-enhanced parametric variations. Incremental interconnect and/or device modeling using the delta information can be empirical, physical, or semi-empirical (hybrid), but is not so limited.

In contrast to typical IC design processes that modify parameters defining or characterizing an IC design in response to timing and/or geometry verification processes, the delta flow includes processes that generate and operate on differences or "deltas" in parameters that define (or characterize) the IC design. As an example, the deltas may include one or more of incremental timing differences (also referred to herein as "timing variations", "delta-timing", or "Δτ") and incremental dimensional differences (also referred to herein as "dimensional variations", "delta-geometry", or "Δd/Δt") associated with the IC design. The differences may also include incremental differences in circuit parameters used to define or characterize the IC design (e.g., leakage power). The circuit parameters include but are not limited to resistance (also referred to herein as "resistance variations", "delta-resistance", or "ΔR"), capacitance (also referred to herein as "capacitance variations", "delta-capacitance", or "ΔC"), and inductance (also referred to herein as "inductance variations", "delta-inductance", or "ΔL"), and on the device side, leakage power, etc.

The delta flow 101 includes processes that operate on input information that may include delta information and, in response, generates delta budgetary assignments corresponding to one or more devices or interconnects of the IC design. The delta budgetary assignment generated by the delta flow 101 can include difference information relating to any number of parameters used to define the IC design as described above, including but not limited to resistance, capacitance, inductance, circuit constants, circuit or device parameters, physical or geometric parameters, and timing parameters. The input delta information is provided by or derived from other delta flow processes or other processes of the EDA and/or design-to-manufacturing systems, but is not so limited.

The delta flow 101 also generates a delta (or incremental) output that reports the source and/or the location of differences in circuit parameters that may violate or adversely impact the IC design. The delta output is provided separately from the original information of the parameters with which the delta output is associated (e.g., the ΔC is reported separately for a particular value of capacitance C used to characterize a device of the circuit).

Additionally the delta (incremental) information of the delta flow 101 of an embodiment is provided as an input into any number of processes of the IC design flow, including other delta flow processes. Use of the incremental delta information in the design flow reduces the dependency of the design process on library and other information of the design process by efficiently providing the difference information of particular circuit parameters. The reduced dependency on design library information increases the efficiency of the IC design process because it reduces the number of lookup or simulation operations that are to be performed during the design process. Further, the delta information allows for incremental processing of only difference information associated with a parameter instead of re-processing the entire circuit after substituting one or more parameters with new parameters.

In the following description, numerous specific details are introduced to provide a thorough understanding of, and enabling description for, embodiments of the systems and methods for fabricating ICs. One skilled in the relevant art, however, will recognize that these embodiments can be practiced without one or more of the specific details, or with other components, systems, etc. In other instances, well-known structures or operations are not shown, or are not described in detail, to avoid obscuring aspects of the disclosed embodiments of the systems and methods for fabricating ICs.

Figure 1B:
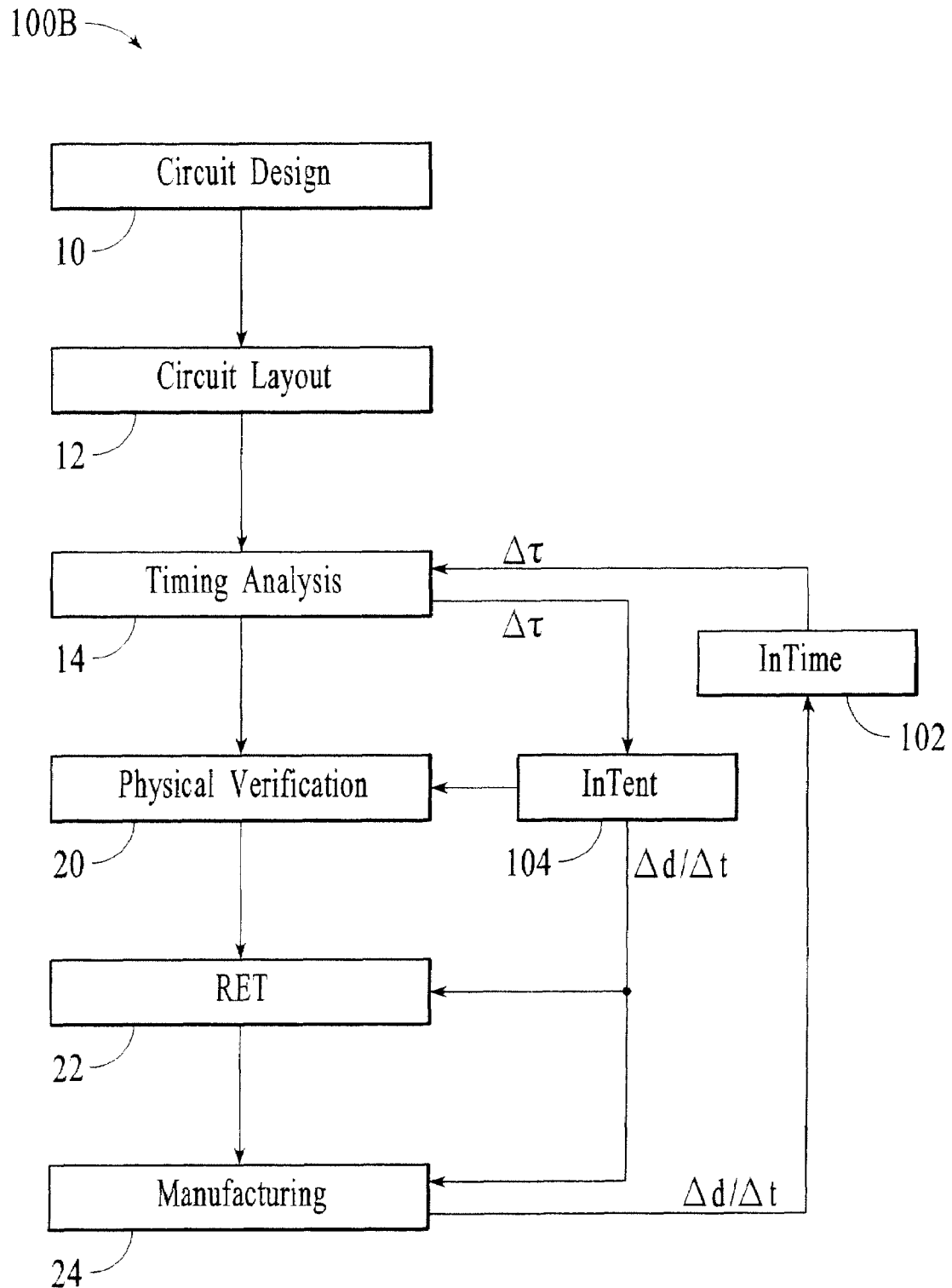
FIG. 1B is a block diagram of an IDMP 100B that includes a delta flow for use in fabricating integrated circuits ("ICs"), under an embodiment.

FIG. 1B is a block diagram of an IDMP 100B that includes a delta flow for use in fabricating ICs, under an embodiment. The IDMP 100B of an embodiment includes but is not limited to one or more of circuit design processes 10, circuit layout processes 12 (including placement and routing), timing analysis processes 14, physical (geometry) verification processes 20, RET processes 22, manufacturing processes 24, delta-geometry timing prediction processes 102 (also referred to as "InTime processes"), and delta-timing shape prediction processes 104 (also referred to as "InTent processes"). The delta flow comprises the InTime processes 102 and the InTent processes 104, but alternative embodiments may include either the InTime processes 102 or the InTent processes 104 operating alone, as well as any combination of components of the InTime processes 102 and/or the InTent processes 104 operating in any number of combinations. While one or more of the circuit design processes 10, layout processes 12, timing analysis processes 14, InTime 102, and InTent processes 104 may be components of the design process, the embodiment is not limited to this process flow as any of these processes 10, 12, 14, 102, and/or 104 can be components of any other part of the IC fabrication process. Likewise, while one or more of the geometry verification processes 20, RET processes 22, and manufacturing processes 24 may be components of the manufacturing process, the embodiment is not limited to this process flow as any of these processes 20, 22, and/or 24 can be components of any other part of the IC fabrication process.

As electronic circuit designers generally rely upon computer programs to assist and automate the circuit design process because the circuits typically contain a very large number of individual pieces (also referred to as "cells"), the IDMP 100B may include or coupled with one or more components of an EDA system or other electronic system used to automate the circuit design and fabrication of IC devices, but is not so limited. Therefore, while the description below refers to the IDMP 100B, it is understood that the IDMP components 10-104 may function as independent components each coupled alone or in one or more different combinations to one or more EDA systems known in the art.

The IDMP 100B generally receives one or more high-level behavioral descriptions of an IC device (e.g., in HDL languages like VHDL, Verilog, etc.) and translates these high-level design-language descriptions into descriptions of various levels of abstraction, also referred to as "netlists". A netlist describes the IC design and comprises nodes (elements) and edges (connections between nodes), and can be represented using a directed cyclic graph structure having nodes which are connected to each other with signal lines. At a higher level of abstraction, a generic netlist is produced based on technology-independent primitives. The IDMP 100B can translate the generic netlist into a lower level technology-specific netlist in accordance with a technology-specific library. The technology-specific library, also referred to herein as a "cell library" or "device library", includes gate-specific models for use in estimating timing and power parameters of the design. The IDMP 100B system stores netlists in machine readable media, and processes and verifies the information of the netlists to produce a physical device layout in mask form which can be used to directly implement structures in silicon to realize the physical IC device.

Circuit designers generate or produce the high-level description of the circuit design in a hardware description language such as Verilog or VHDL in the circuit design process 10. This high-level description is converted into a netlist that is a description of the electronic circuit which specifies the cells that compose the circuit and which pins of which cells are to be connected together using wires (also referred to herein as "interconnects" or "nets"). The netlist does not specify where on a circuit board or silicon chip the cells are placed or the routing of the wires which connect the cells.

The IDMP 100B generates a layout using information of the netlist in one or more layout processes 12. The layout process 12 determines cell placement and interconnect routing given the geometry of a silicon chip, for example, using a placement process and a routing process to produce an IC design layout.

The cell placement process uses information of the netlist to identify a potential location for each cell on the silicon chip, with the locations typically specified in two dimensional spatial coordinates (e.g., (x, y) coordinates) on the chip. The locations are typically selected to optimize certain objectives such as wire length, wire routing, circuit speed, circuit power consumption, and/or other criteria, subject to the condition that the cells are spread evenly over the chip and that there is no overlapping of cells. The output of the layout process includes a data structure including the (x, y) location for each cell of the IC design.

The IDMP 100B supplies the netlist and the cell location data structure, generated by the placement process, to an automatic wire routing process (also referred to as a "router"). The router generates wire geometry within the data structure for connecting pins together. The router determines the interconnect paths from a topological standpoint and lays down the actual geometries and connected wire segments in appropriate layers of the chip. The wire geometry data structure and cell placement data structure together are used to make the final geometric database used in fabrication of the IC.

The IDMP 100B couples information of the IC design layout to the InTime process 102 through any combination of the processes 10-24 of the IDMP 100B. In addition to the IC design layout the InTime process 102 also receives dimensional variation information from one or more geometry verification processes (not shown), but is not so limited. Alternative embodiments may include processes that derive the dimensional variation information from information of one or a combination of the processes 10-24 of the IDMP 100B.

The dimensional variation information of an embodiment includes at least one of lateral and/or vertical dimensional variation information ("$\Delta d$") (e.g., length or width variations) and thickness variation information ("$\Delta t$") associated with circuit components of the layout, but can include additional variation parameters or information. The circuit components include, for example, the devices and interconnects typical of those found in the IC design. The dimensional variation information therefore includes delta-geometry information (collectively referred to as "delta-geometry $\Delta d/\Delta t$" or "$\Delta d/\Delta t$") as appropriate to components of each layer and each location (coordinates x, y) on the chip, but is not so limited. As an example, the delta-geometry $\Delta d/\Delta t$ of an embodiment corresponds to lithographic and/or other proximity-based changes that introduce variations $\Delta d/\Delta t$ in the geometry. The thickness variation information $\Delta t$ of an embodiment includes CMP-induced metal thickness variations obtained from data of a systematic characterization of each layer of the chip.

The InTime process 102 generally uses the delta-geometry $\Delta d/\Delta t$ to integrate information of the timing and geometry verification processes of IC fabrication (information of design perturbations received from one or more manufacturing processes (e.g., RET, inspection, etc.)) into the geometry (layout) of the IC design. The InTime process 102 of an embodiment integrates timing and geometry constraints of an IC design into the design process by integrating the delta-geometry $\Delta d/\Delta t$ from geometry verification processes (manufacturing stage) into circuit models to form timing reports and/or enhanced circuit models. The InTime process 102 of an embodiment may use information received from an RET-prediction tool that generates the delta-geometry $\Delta d/\Delta t$, as described in the Related Applications referenced above.

Component processes of the IDMP 100B, including the InTime process 102, use the enhanced circuit models to generate a simulated model of the IC design and, from the simulated model, generate timing variation information ("$\Delta \tau$"), as described below. The IDMP 100B couples the $\Delta \tau$ information to the timing analysis process 14 and, additionally, may couple the $\Delta \tau$ information to one or more of the circuit design process 10, layout process 12, geometry verification process 20, RET process 22, and manufacturing process 24, each of which may be one or more processes of an EDA system as known in the art.

The IDMP of an embodiment also couples the $\Delta \tau$ information of the timing analysis to the InTent process 104. The InTent process 104 uses the the $\Delta \tau$ information to produce information or rules of the delta-geometry $\Delta d/\Delta t$ for use in further processing of the IC design by components of the IDMP 100B including the InTime process 102, as described below. The delta-geometry $\Delta d/\Delta t$ output of the InTent process 104 couples to manufacturing geometry predictor processes, as described in the Related Applications, and may couple to other verification processes of the design/manufacturing flow.

Figure 2:
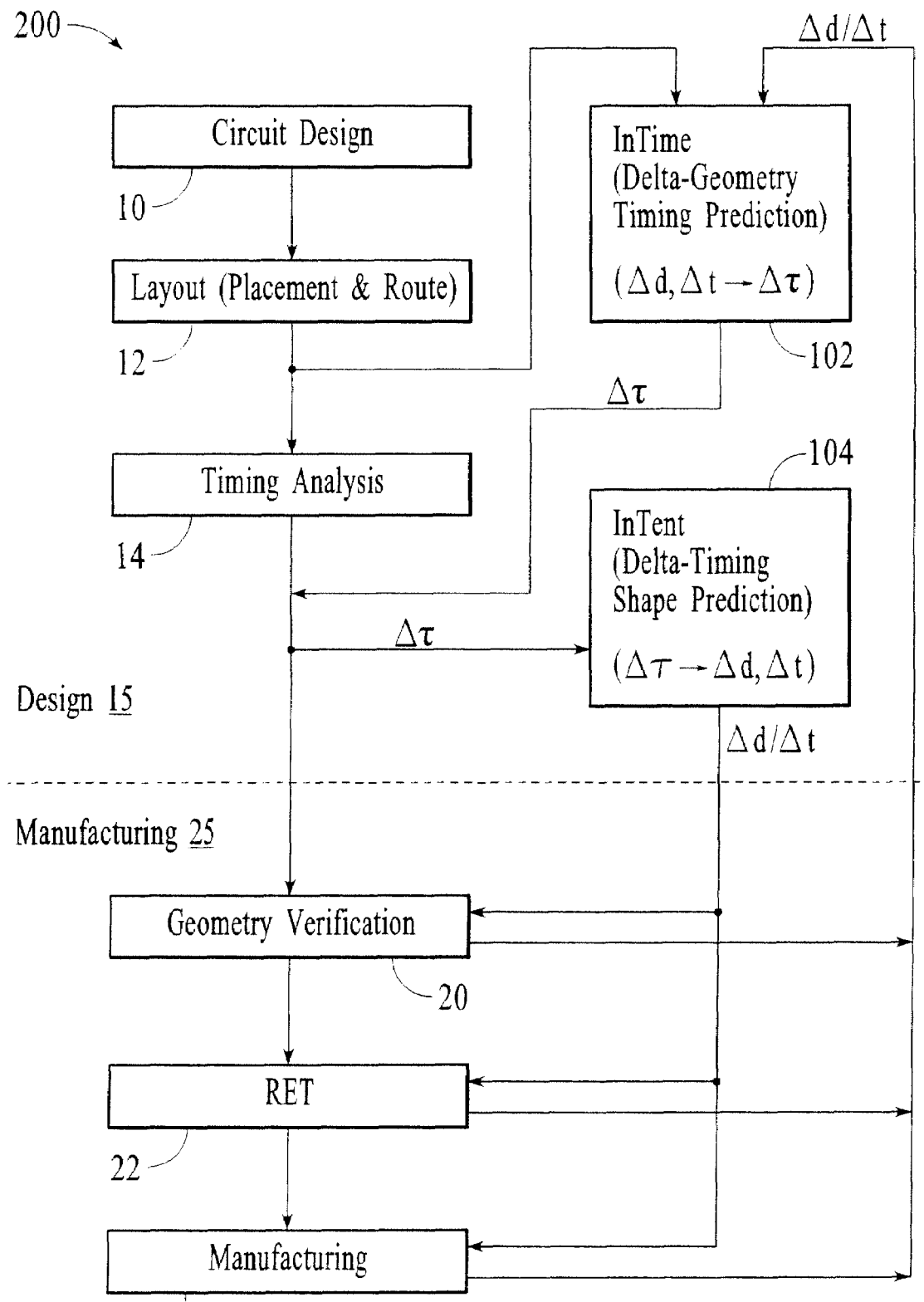
FIG. 2 is a block diagram of an IDMP that includes a delta flow for use in fabricating ICs, under an alternative embodiment.

FIG. 2 is a block diagram of an IDMP 200 that includes a delta flow for use in fabricating ICs, under an alternative embodiment. The IDMP 200 of an embodiment includes but is not limited to one or more of circuit design processes 10, layout processes 12, timing analysis processes 14, geometry verification processes 20, RET processes 22, manufacturing processes 24, InTime processes 102, and InTent processes 104, as described above. The component processes of the IDMP 200 generally function as described above with reference to FIG. 1. In addition, the InTime process 102 of an embodiment receives the delta-geometry information $\Delta d/\Delta t$ from one or more processes of the design 15 and/or manufacturing 25 flow, and performs verification and/or timing prediction using the delta-geometry, but is not so limited. Further, the InTent process 104 receives delta-timing information from one or more processes of the design 15 and/or manufacturing 25 flow and performs shape slack ($\Delta d/\Delta t$ budgeting), coupling the rules of the resulting delta-geometry $\Delta d/\Delta t$ to one or more processes of the design 15 and/or manufacturing 25 flow and/or the InTime process 102.

The delta flow of the InTime process 102 generally receives the IC design and the delta-geometry information as inputs in one or more forms. From the inputs the InTime process 102 extracts delta information relating to incremental differences in circuit parameters that define or characterize one or more devices and/or interconnects (or interconnect segments) of the IC design. The extraction of delta information as used herein includes extraction of information relating to any components of the circuit design and is not limited to extraction of information of interconnects and/or devices. The extracted delta information can include delta-capacitances, delta-resistances, and/or delta-inductances, for example, but may include delta-information of any other parameters that describe the IC design. The InTime process 102 also generates a delta (or incremental) output that reports the source and/or the location of the delta information that violate or adversely impact the IC design. As one example, a delta-capacitance $\Delta C$ and a delta-resistance $\Delta R$ are reported separately for a particular value of capacitance C and resistance R, respectively, that violate design constraints associated with a specified interconnect of the IC design.

Figure 3:
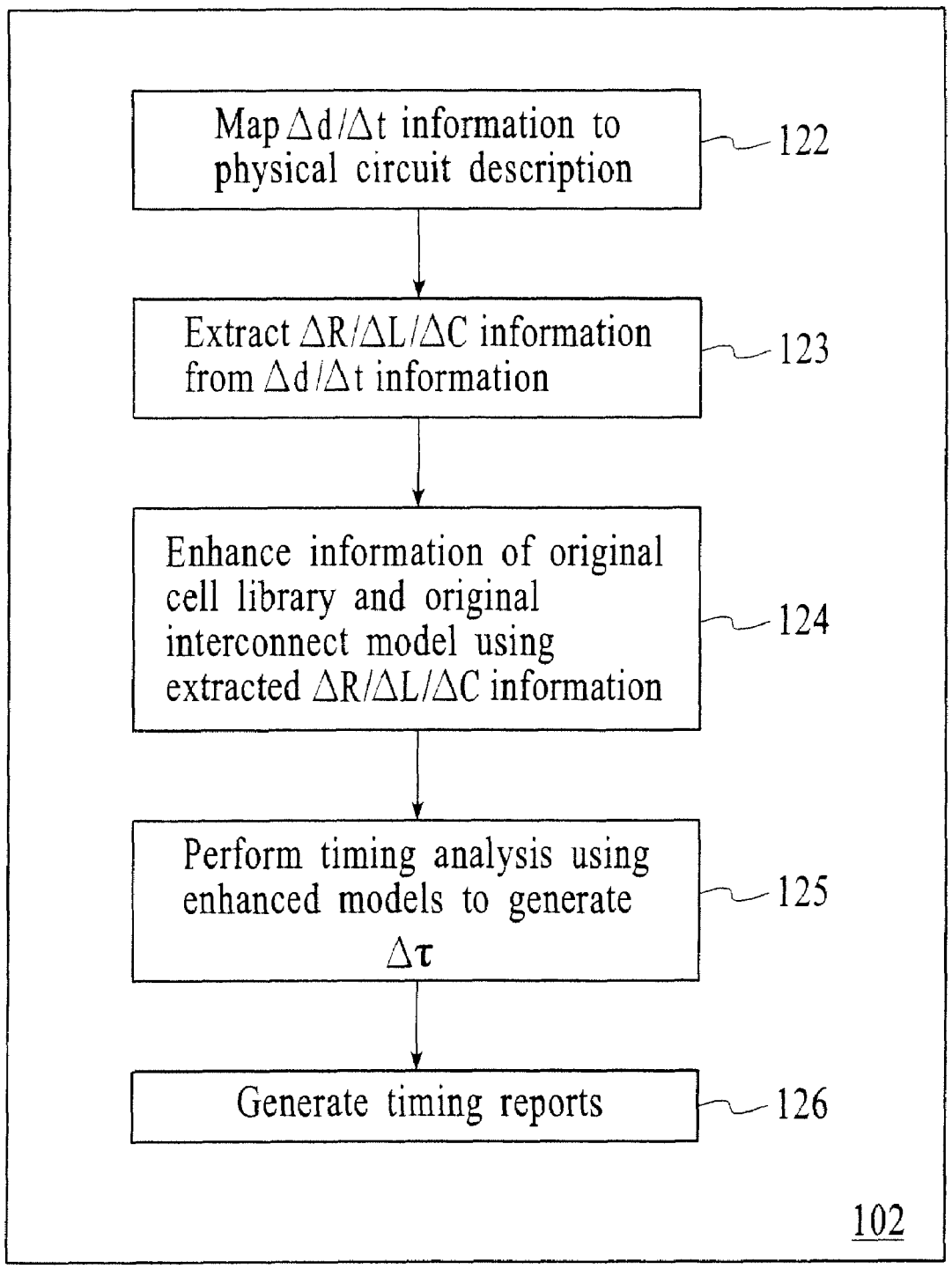
FIG. 3 is a flow diagram for the delta-geometry timing prediction processes ("InTime processes"), under an embodiment.

The InTime process 102 of an embodiment integrates timing and geometry constraints of an IC design into the design process, as described above. As one example, FIG. 3 is a flow diagram for the InTime process 102, under an embodiment. Generally, the InTime process 102 receives a design of an IC that includes numerous devices and numerous interconnects. The InTime process 102 integrates delta-geometry information of the devices and/or interconnect structures into the design using delta information extracted from the delta-geometry information. The InTime process 102 subsequently produces reports that include the delta-geometry information and/or timing variation information relating to the delta-geometry. In addition to the reports, the InTime process 102 may enhance library information of an embodiment using the delta-geometry information generated by the InTime process 102. The extracted delta-geometry information includes difference information relating to any number of parameters used to define the IC design (e.g., resistance, capacitance, inductance, circuit constants, circuit or device parameters, physical or geometric parameters, and timing parameters), as described above. The InTime process 102 and/or component processes of the IDMP subsequently generate electrical models of the IC using the extracted delta information.

The delta flow described herein reduces the dependency of the IC design flow on the cell/interconnect libraries through the use of incremental delta information of parameters of the IC design. However, the InTime process 102 of an embodiment may also use delta information of the delta flow to modify the device and/or interconnect libraries, as described above. Generation of the modified device or cell library includes incrementally modifying information of device models of an original device library using delta information of the delta flow as appropriate to each device model of the library.

As described above, the InTime process 102 receives a physical description of the IC design layout and dimensional variation information that includes at least one of gate length variations $\Delta d$ and thickness variations $\Delta t$ as appropriate to circuit components (devices and interconnects) of the layout. The physical description may be a graphical data representation or a text-file representation, but is not so limited. The InTime process maps the delta-geometry $\Delta d$ of devices and the delta-geometry $\Delta d/\Delta t$ of interconnects to the physical description of the IC, at block 122.

With regard to devices of the layout, the InTime process 102 extracts delta information of parameter variations (e.g., delta-capacitance $\Delta C$) of each device of the layout by deriving the delta information of each device from the delta-geometry $\Delta d$ corresponding to each device, at block 123. The InTime process 102 uses the derived delta information to generate timing variation information and/or to enhance the information of the original cell library of the IDMP system, at block 124. The enhancing of the library information includes providing separate reports including the delta information of the parameter variations, and/or modifying or re-characterizing information of library device models with the delta information. Modification of the device models can include linking or appending information of the parameter variations to one or more netlists (e.g., SPICE netlist) or models (e.g., Berkeley short-channel IGFET model ("BSIM")). Modification of the device models can also include replacing information of one or more netlists with new information that includes the parameter variations.

Turning to interconnects of the layout, and following mapping of the delta-geometry $\Delta d/\Delta t$ to a physical description of the IC, at block 122, the InTime process 102 extracts information of one or more of delta-capacitance $\Delta C$, delta-resistance $\Delta R$, and delta-inductance $\Delta L$ of each interconnect of the layout by deriving the delta information $\Delta C/\Delta R/\Delta L$ of each interconnect from the delta-geometry $\Delta d/\Delta t$ corresponding to each interconnect, at block 123. The InTime process 102 uses the derived delta information $\Delta C/\Delta R/\Delta L$ to enhance the information of the original interconnect library of the IDMP system, at block 124. The enhancing of the library information includes providing separate reports including the delta information $\Delta C/\Delta R/\Delta L$, and/or modifying or re-characterizing information of library interconnect models (e.g., SPEF files) with the delta information $\Delta C/\Delta R/\Delta L$. Modification of the device models can include linking or appending the delta information $\Delta C/\Delta R/\Delta L$ to one or more netlists or models. Modification of the interconnect models can also include replacing information of one or more netlists with new information that includes the delta information $\Delta C/\Delta R/\Delta L$. Following enhancement of the library models as appropriate to the cell and interconnect libraries, the InTime process 102 generates electrical models of the IC using the enhanced device and interconnect models and performs timing analyses of the IC models, at block 125. The timing analyses results include information of timing variations $\Delta \tau$ of the IC model, but are not so limited. The InTime process 102 produces timing reports that include information of timing variations $\Delta \tau$, at block 126.

Figure 4:
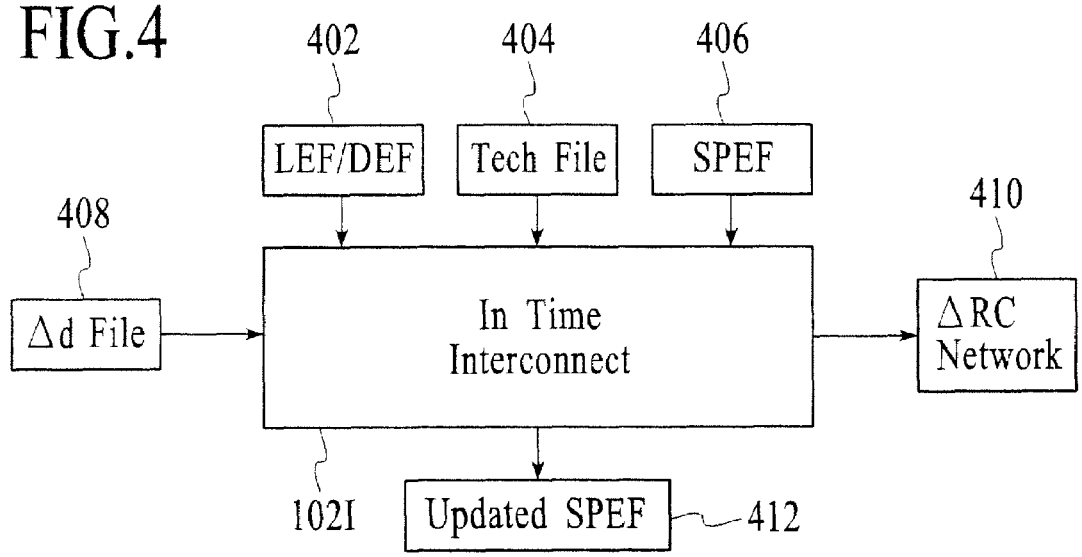
FIG. 4 is a block diagram of the InTime process for use in generating delta information corresponding to interconnect structures, under an embodiment.

FIG. 4 is a block diagram of the InTime process 1021 for use in generating delta information corresponding to interconnect structures ("InTime Interconnect"), under an embodiment. The InTime process 1021 receives information of the IC design in one or more of a library exchange format ("LEF")/design exchange format ("DEF") ("LEF/DEF") file 402, a tech file 404, and a standard parasitic delay format ("SPEF") file 406. The InTime process 1021 also receives delta-geometry information of the interconnects in a $\Delta d$ File 408. The information of the LEF/DEF file, 402, tech file 404, SPEF file 406, and $\Delta d$ File 408 can correspond to one or more pre-specified segments of the IC design, or to the entire IC design, but are not so limited.

The InTime process 1021 uses the IC design information and the delta-geometry information to generate delta parameters 410 as described herein. The delta parameters 410 characterize incremental differences in circuit parameters used to define or characterize the IC design, where the circuit parameters include but are not limited to delta-resistance $\Delta R$ and delta-capacitance $\Delta C$. The delta parameters 410 are subsequently introduced into the IC design processes. The InTime process 1021 can also enhance information of the SPEF file 406 using the delta parameters 410 to generate an updated SPEF file 412. Enhancement of the SPEF file 406 includes mapping, linking, or appending information of the delta parameters 410 to the SPEF file 406, as described above.

Figure 5:
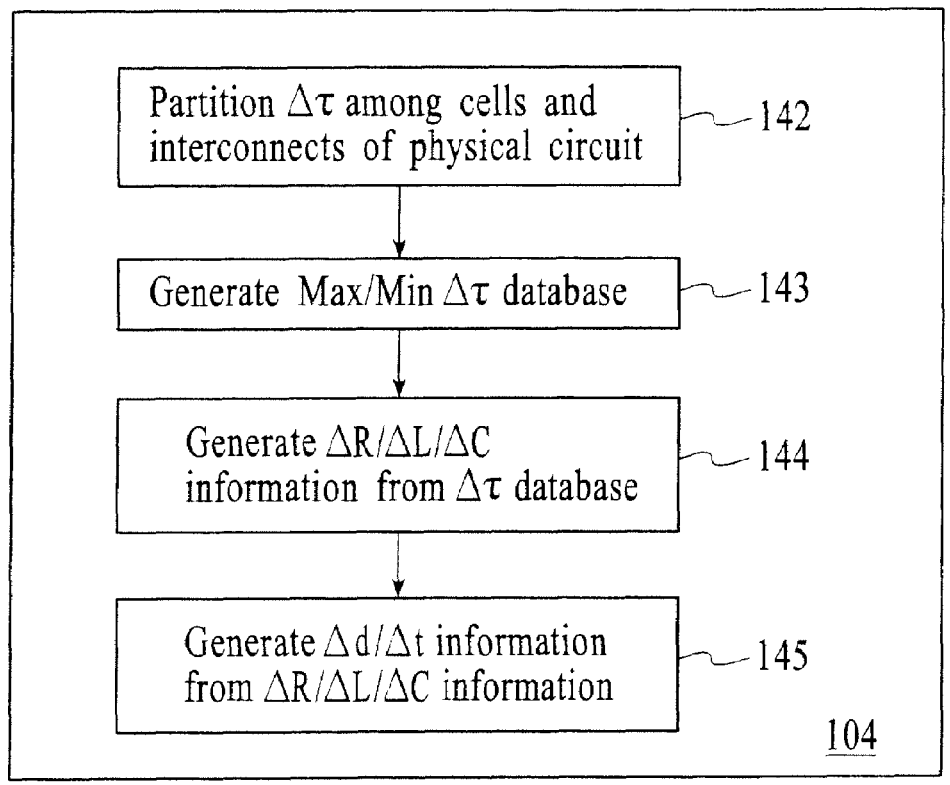
FIG. 5 is a flow diagram for the delta-timing shape prediction processes InTent processes, under an embodiment.

The InTent process 104 produces rules of the delta-geometry $\Delta d/\Delta t$, as described above with reference to FIG. 1. As one example, FIG. 5 is a flow diagram for the InTent process 104, under an embodiment. Generally, the InTent process 104 receives timing variation information $\Delta \tau$ from one or more timing analyses performed on the IC model, as described above with reference to FIG. 1. The InTent process partitions the timing variation $\Delta \tau$ by partitioning slack time indicated by the timing variation $\Delta \tau$ among the cells and interconnects of the IC model, at block 142. A timing variation $\Delta \tau$ database is generated that includes maximum and minimum timing variations $\Delta \tau$ associated with the partitioned slack time as appropriate to each cell and/or interconnect, at block 143.

Using information of the timing variation $\Delta \tau$ database the InTent process 104 produces delta information (e.g., delta-capacitance $\Delta C$, delta-resistance $\Delta R$, delta-inductance $\Delta L$) corresponding to each device of the IC model by deriving the delta information $\Delta R/\Delta C/\Delta L$ from the timing variations $\Delta \tau$ corresponding to each device/cell, at block, 144, and described below with reference to Equations 1-7. This derivation includes for example determining or calculating delta information for a cell by applying the timing variation $\Delta \tau$ of the cell to the corresponding cell description of the modified cell library.

Similarly, the InTent process 104 produces information of delta-capacitance $\Delta C$, delta-resistance $\Delta R$, and/or delta-inductance $\Delta L$ corresponding to each interconnect by deriving the delta information $\Delta C/\Delta R/\Delta L$ from the timing variations $\Delta \tau$ corresponding to each interconnect, at block 144. This derivation includes for example determining or calculating the delta information $\Delta C/\Delta R/\Delta L$ for an interconnect by applying the timing variation Δτ of the interconnect to the corresponding modified interconnect description of the modified interconnect library. The InTent generates delta-geometry Δd to each device and delta-geometry Δd/Δt corresponding to each interconnect from the derived delta information ΔC/ΔR/ΔL as appropriate to the cell or interconnect, at block 145. While this example describes the InTent process 104 as deriving the delta information ΔC/ΔR/ΔL of an interconnect structure, the InTent process 104 may derive any delta information that defines (or characterizes) the IC design.

Figure 6:
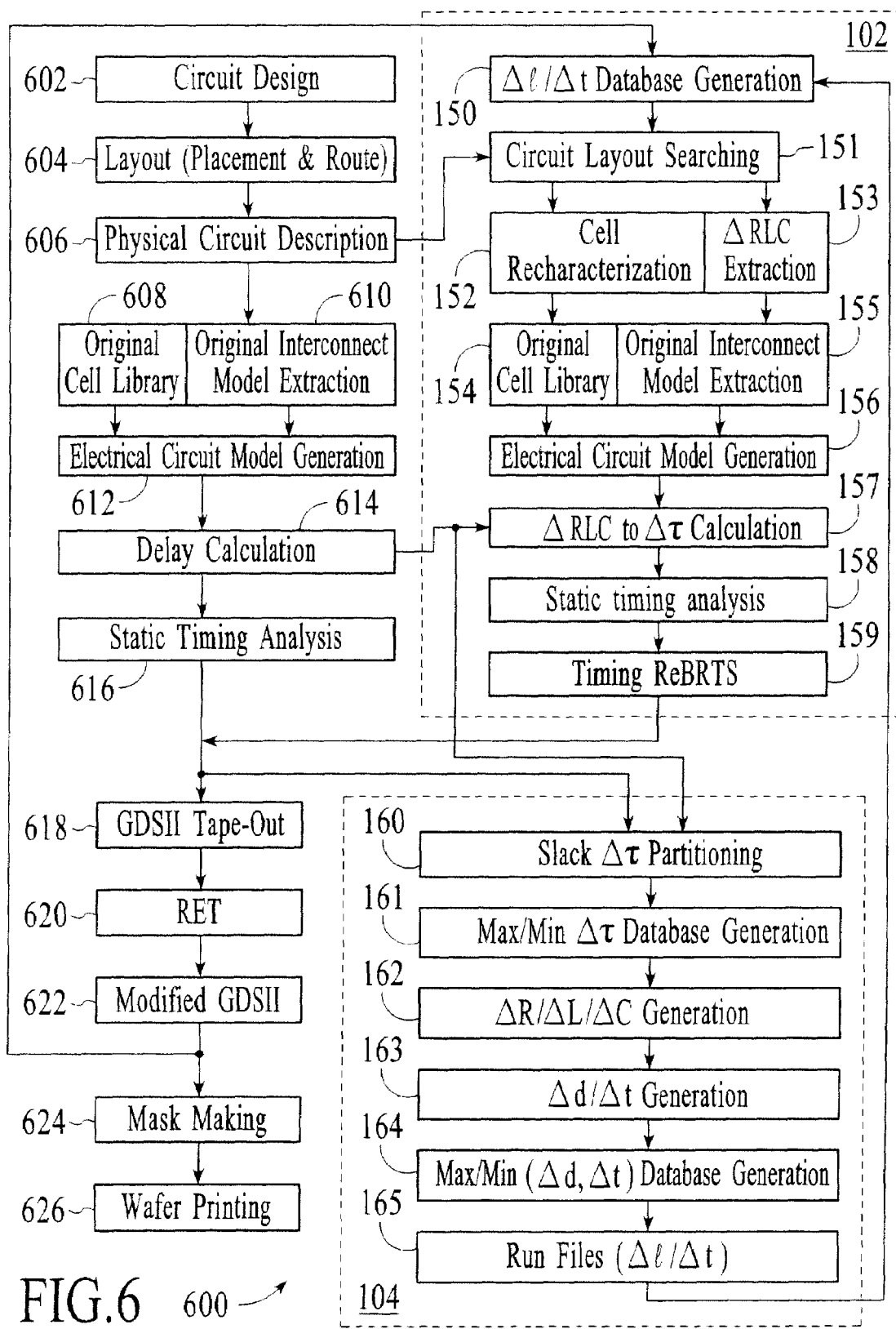
FIG. 6 is a block diagram of an IDMP that includes delta-geometry timing prediction processes (InTime) and delta-timing shape prediction processes (InTent) for use in fabricating ICs, under the embodiments of FIG. 2, FIG. 3, and FIG. 5.

FIG. 6 is a block diagram of an IDMP 600 that includes delta-geometry timing prediction processes (InTime) and delta-timing shape prediction processes (InTent) for use in fabricating ICs, under the embodiments of FIGS. 1, 2, 3, 4, and 5. This example IDMP 600 shows specific couplings between the InTime process 102, the InTent process 104, and processes 602-626 of an EDA system. The InTime process 102 and the InTent process 104 generally function as described herein, and further with reference to FIG. 3 and FIG. 5, respectively. The processes 602-626 of the EDA system of an embodiment function in accordance with the processes of one or more EDA systems known in the art, but are not so limited.

Component processes of the IDMP generate enhanced cell libraries by enhancing original library information typical to EDA systems/processes with delta information. The enhanced or modified device models enhance the original device models to include delta-geometry Δd of devices of the design, as described above. This enhancement includes modeling the devices so as to enable extraction of the capacitive variations ΔC from the delta-geometry Δd corresponding to each device. The modification or re-characterization of device parameters (cell libraries) of an embodiment imposes a number of principles, one of which is that the re-characterized devices are fully compatible with existing device models. Also, the re-characterized device parameters are compatible with signal delay models, where $$\text{Signal Delay} = k(V_{dd}/WI_{on})(C_{in}+C_{out}+C_{wire}).$$

Furthermore, the re-characterized device parameters provide electrical current conservation in accordance with $$\text{Drain-Source Current ("Ids")} = \mu_{eff} C_{ox}(W/L)[(V_g-V_t)V_{ds}-(m/2)V_{ds}^2].$$

Figure 7:
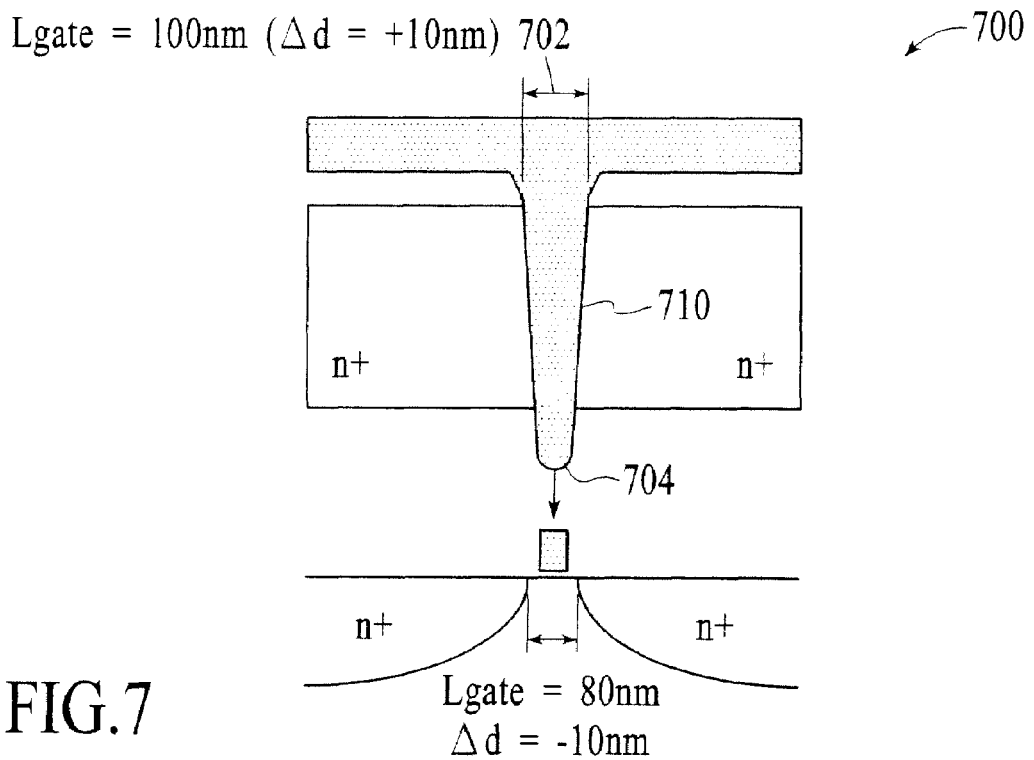
FIG. 7 is a block diagram of a transistor of an enhanced IDMP device model, under an embodiment.

The modified device model of an embodiment (also referred to herein as the "IDMP device model") assumes that a transistor, for example, does not have the uniform gate length typically used in device libraries. Instead, the IDMP device model assumes a transistor with a non-uniform gate length. FIG. 7 is a block diagram of a transistor 700 of the IDMP device model with a non-uniform and varying gate length, under an embodiment. This example transistor 700 assumes a non-zero variation in gate length across the gate 710, an assumption arrived at using empirical data. As such, the gate length varies across the gate 710 from a length of approximately 100 nm (gate length variation Δd is approximately +10 nm) near the interconnection end 702 of the gate 710 to a length of approximately 80 nm (Δd is approximately −10 nm) near the end of the gate poly 704. While gate length variations Δd of +10 nm and −10 nm are shown in this example, and the variations Δd are uniform across the gate length, the IDMP model is not limited in application to transistors having exactly these characteristics.

Figure 8:
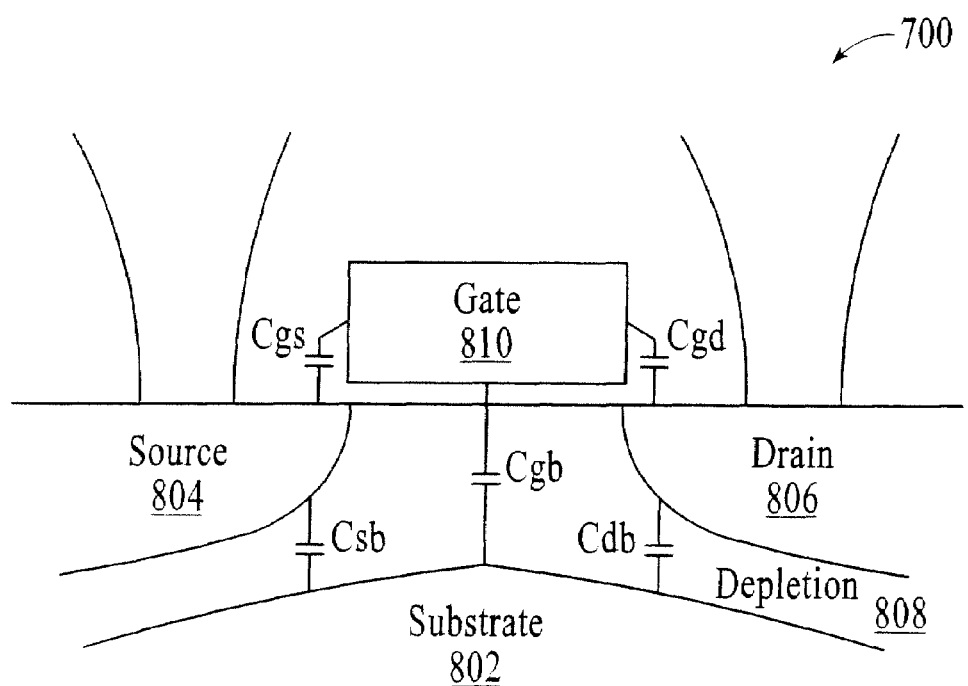
FIG. 8 is a block diagram of gate/junction capacitances of IDMP device model transistors, under an embodiment.

The IDMP device model also models devices so as to determine the affects of the gate length variations Δd on the device parameters. Consequently, in addition to the non-uniform gate length, the IDMP device model assumes that a device includes a number of parasitic capacitances some or all of which are likely to be affected by the gate length variations Δd. As an example of the parasitic capacitances, FIG. 8 is a block diagram of gate/junction capacitances of a transistor 700 of the IDMP device model, under an embodiment. The transistor 700 includes a substrate 802, a source region 804, a drain region 806, a depletion region 808, and a gate 810. The parasitic capacitances of the model include, for example, at least one of gate-to-source capacitances ("Cgs"), gate-to-drain capacitances ("Cgd"), source-to-substrate capacitances ("Csb"), gate-to-substrate capacitances ("Cgb"), and drain-to-substrate capacitances ("Cdb").

Using these parasitic capacitances, the IDMP model assumes an input capacitance ("Cin") of the device to be approximately $$Cin = Cgs + Cgd + Cgb.$$

The IDMP model also assumes an output capacitance ("Cout") of the device to be approximately $$Cout = Cdb + Cgd.$$

Continuing with the example using transistor 700, the IDMP device model uses the gate length variation Δd information resulting from the non-uniform/varying gate length model along with the parasitic capacitance model to enhance device parameters of the cell library. FIG. 9 shows example parameters 900 of a modified device model for a transistor with a sub-100 nm gate length, under an embodiment. The gate length variations Δd of the transistor are used to modify parameters of the device model 900 including the effective channel length, threshold voltage, Cgd/Cgs overlap capacitance, input capacitance, and output capacitance, to name a few. The gate length variations Δd may be used to modify other parameters of a device model as appropriate to the device.

Figure 10A:
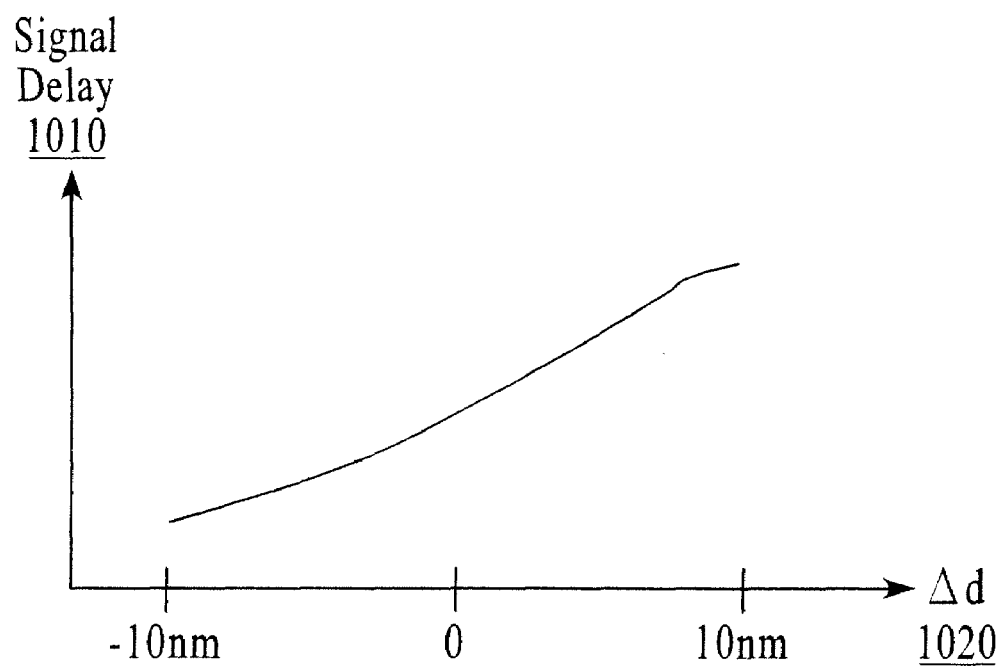
FIG. 10A is a plot of signal delay versus gate length variation for an IDMP device model transistor, under an embodiment.
Figure 10B:
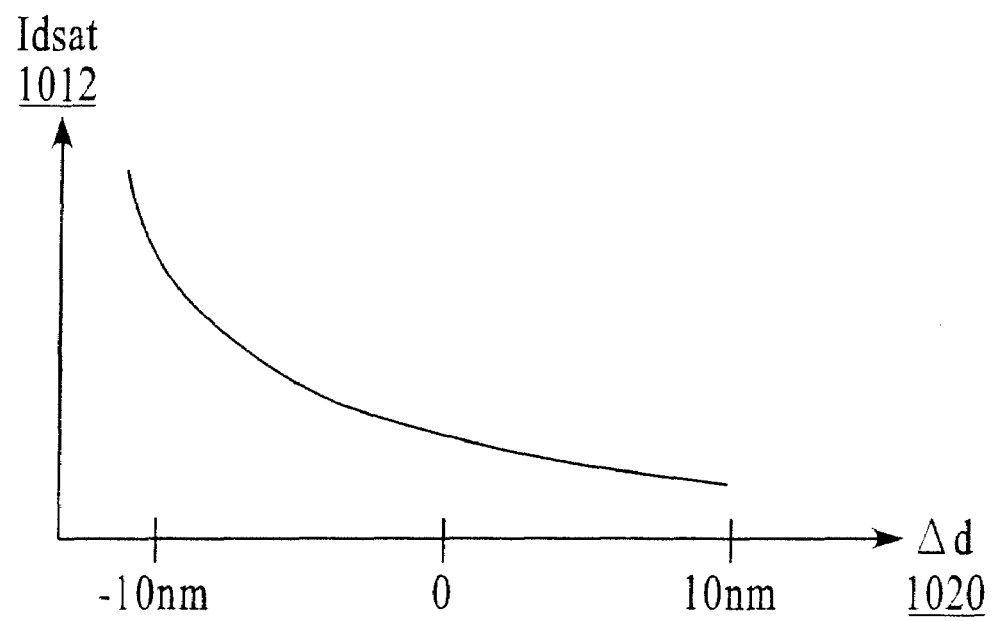
FIG. 10B is a plot of transistor saturation current versus gate length variation for an IDMP device model transistor, under an embodiment.

As an example of the affects of gate length variations Δd on device operations, FIG. 10A is a plot of signal delay 1010 versus gate length variation Δd 1020, under an embodiment. Additionally, FIG. 10B is a plot of transistor saturation current 1012 versus gate length variation Δd 1020, under an embodiment.

In addition to enhancing cell libraries, component processes of the IDMP generate modified interconnect libraries by modifying original libraries typical to EDA systems/processes to include delta-geometry Δd/Δt of interconnects of the design, as described above. This modification includes modeling the interconnects so as to enable extraction of one or more of capacitive variations ΔC, resistive variations ΔR, and inductive variations ΔL of each interconnect from the delta-geometry Δd/Δt corresponding to the interconnect.

Figure 11:
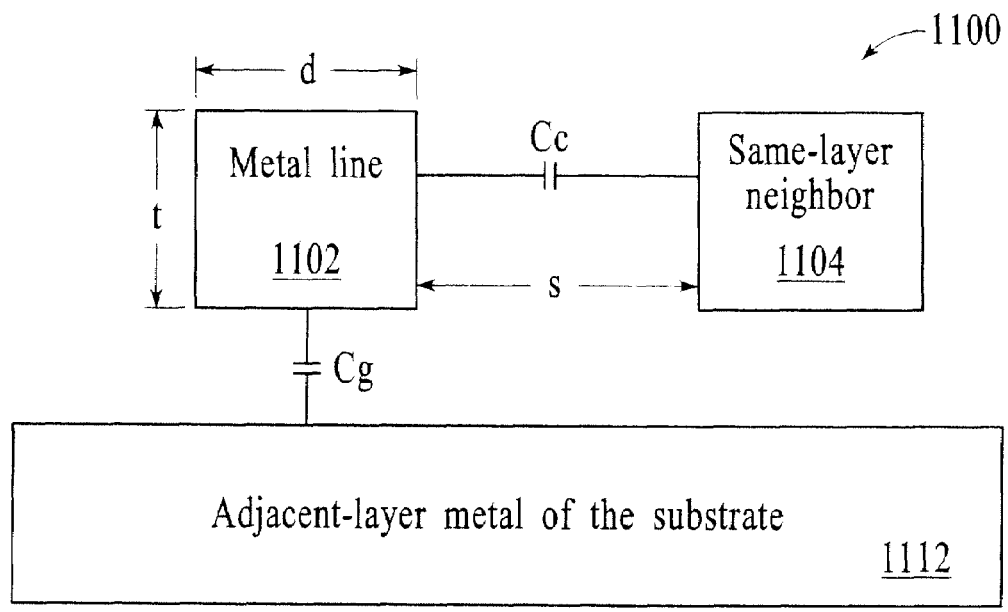
FIG. 11 is a cross-section of an IDMP interconnect model, under an embodiment.

The modification or re-characterization of interconnect parameters (interconnect libraries) of an embodiment begins with an IDMP interconnect model. FIG. 11 is a cross-section of an IDMP interconnect model 1100, under an embodiment. The interconnect model 1100 includes a metal line 1102 having a dimension "d" and a thickness dimension "t". The metal line 1102 is adjacent at least one component 1004 in the same layer of the chip. The metal line 1102 is separated from the component 1104 in the same layer of the chip by distance "s", where the adjacent component can be any device, interconnect, and/or other structure as appropriate to the IC design. Coupling capacitance ("Cc") is present as a result of the adjacent placement of the metal line 1102 to the component 1104.

In addition to the adjacent component 1104 in the same layer, the metal line 1102 is also located adjacent to another layer 1112 of the chip. The adjacent layer 1112 can be any layer or substrate as appropriate to the IC design. Ground capacitance ("Cg") is present as a result of the adjacent placement of the metal line 1102 and the adjacent layer 1112.

Referring to the IDMP interconnect model 1100, the IDMP of an embodiment develops and includes a set of functions describing the relationship between delta-geometry $\Delta d/\Delta t$ and timing variations $\Delta\tau$ of an IC design. The relationship includes both using information of delta-geometry $\Delta d/\Delta t$ to generate timing variations $\Delta\tau$ of the IC design (as described above with reference to the InTime process), and using information of timing variations $\Delta\tau$ to generate delta-geometry $\Delta d/\Delta t$ of the IC design (as described above with reference to the InTent process). For reference, the delta-geometry $\Delta d/\Delta t$ of the interconnects include perturbations $\Delta d$ to dimension d of line 1102 and perturbations $\Delta t$ to thickness dimension t of line 1102. The IDMP set of functions assume delta-geometry $\Delta d/\Delta t$ resulting from manufacturing processes are small compared to the corresponding base-line dimensions d/t, and are in light of weak perturbation theory.

The set of functions of an embodiment are quasi-linear functions describing the relationship between delta-geometry $\Delta d/\Delta t$ and both resistive variations $\Delta R$ (also referred to as the incremental parasitic interconnect resistance $\Delta R$) and capacitive variations $\Delta C$ (also referred to as the incremental parasitic interconnect capacitance $\Delta C$). Assuming that total capacitance of the interconnect includes coupling capacitance Cc and ground capacitance Cg as $$C=Cc+Cg \quad \text{(Equation 1)},$$

the IDMP of an embodiment describes the relationship between delta-geometry $\Delta d/\Delta t$ and resistive variations $\Delta R$ as $$\Delta R/R \approx -\Delta t/t - \Delta d/d \quad \text{(Equation 2)}.$$

Further, the IDMP of an embodiment describes the relationship between delta-geometry $\Delta d/\Delta t$ and capacitive variations $\Delta C$ as $$\Delta C/C \approx (Cc/C)(\Delta t/t)+(Cc/C)(\Delta d/2s)+(Cg/C)(\Delta d/d) \quad \text{(Equation 3)}.$$

The IDMP of an embodiment modifies these relationships to include one or more modulation factors or variables. The modulation factors, represented as "k1", "k2", "k3", "k4", and "k5", modulate effects of any inaccuracies associated with using the weak perturbation approach, and any additional amount of fringing capacitance found in the coupling capacitance Cc. The modified relationship between delta-geometry $\Delta d/\Delta t$ and resistive variations $\Delta R$ (Equation 2) including modulation factors therefore becomes $$\Delta R/R \approx -k1(\Delta t/t)-k2(\Delta d/d) \quad \text{(Equation 4)}.$$

The modified relationship between delta-geometry $\Delta d/\Delta t$ and capacitive variations $\Delta C$ (Equation 3) including modulation factors becomes $$\Delta C/C \approx k3(Cc/C)(\Delta t/t)+k4(Cc/C)(\Delta d/2s)+k5(Cg/C)(\Delta d/d) \quad \text{(Equation 5)}.$$

Figure 12:
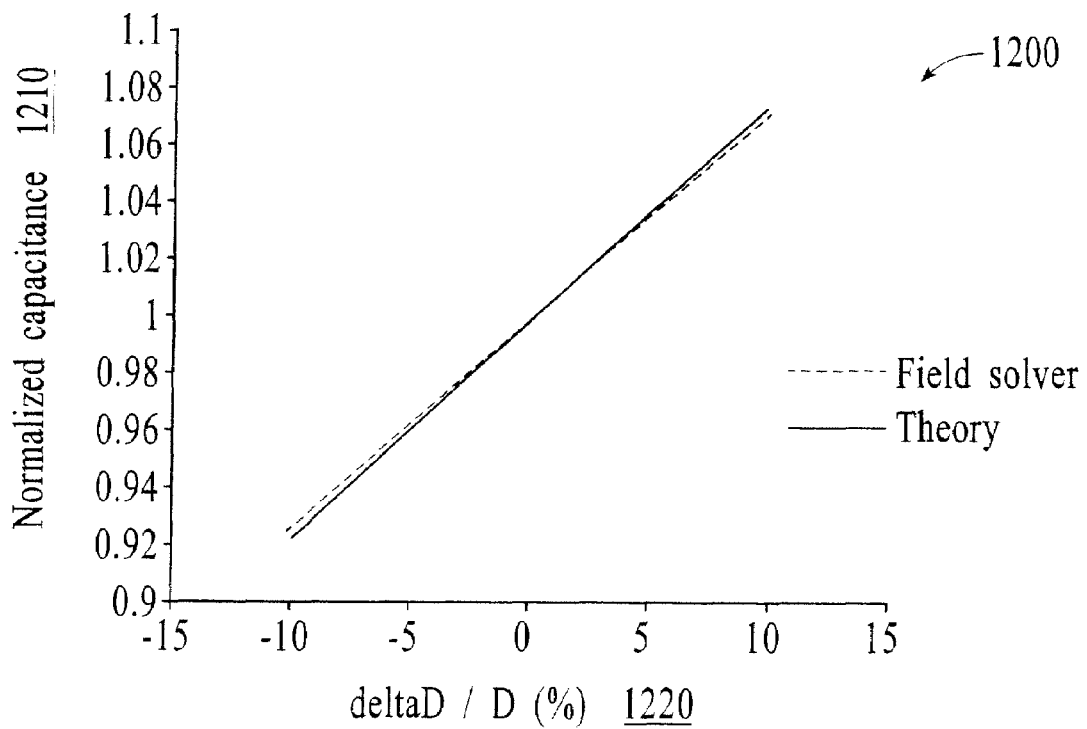
FIG. 12 is a plot of capacitive variations (normalized) versus interconnect perturbations Δd (as a percentage of dimension d) of an IDMP interconnect model, under an embodiment.

Using the capacitive variations $\Delta C$ as an example, a comparison of solutions resulting from Equation 4 and Equation 5 along with circuit simulations (generated with capacitance filed solver and SPICE simulations) shows that the relationship between capacitive variations $\Delta C$ (normalized) and perturbations $\Delta d$ in metal line dimension d (as a percentage of dimension d) are approximately linear. FIG. 12 is a plot 1200 of capacitive variations (normalized) 1210 versus interconnect perturbations $\Delta d$ (as a percentage of dimension d) 1220, under an embodiment.

Figure 13:
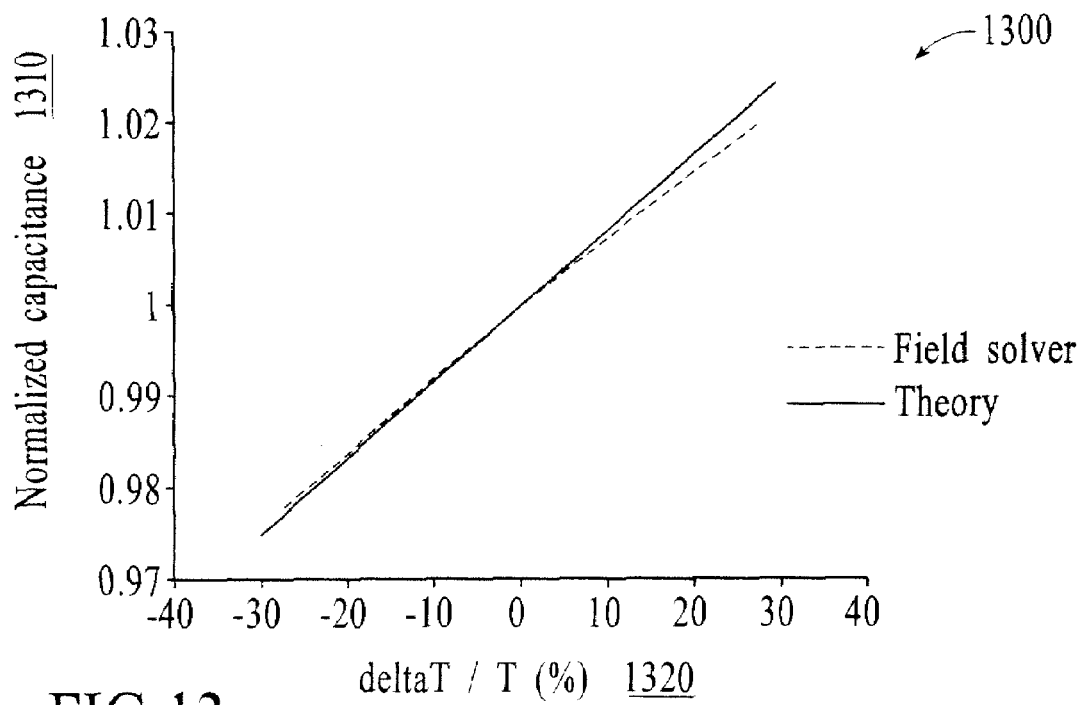
FIG. 13 is a plot of capacitive variations (normalized) versus interconnect perturbations Δt (as a percentage of dimension t) of an IDMP interconnect model, under an embodiment.

Similarly, a comparison of solutions resulting from Equation 4 and Equation 5 along with circuit simulations shows that the relationship between capacitive variations $\Delta C$ (normalized) and perturbations $\Delta t$ in metal line dimension t (as a percentage of dimension t) are approximately linear. FIG. 13 is a plot 1300 of capacitive variations (normalized) 1310 versus interconnect perturbations $\Delta t$ (as a percentage of dimension t) 1320, under an embodiment.

The set of functions of an embodiment also describe the relationship between delta-geometry $\Delta d/\Delta t$ and timing variations $\Delta\tau$. Using the same assumptions stated above, and with reference to Equations 1-5, the IDMP of an embodiment describes the relationship between the timing variations $\Delta\tau$ and both the resistive variations $\Delta R$ and capacitive variations $\Delta C$ as $$\Delta\tau/\tau \approx \Delta R/R+\Delta C/C \quad \text{(Equation 6)}.$$

Expanding Equation 6 using information of Equation 4 and Equation 5 provides $$\Delta R/R+\Delta C/C=[k3(Cc/C)-k1](\Delta t/t)+k4(Cc/C)(\Delta d/2s)+[k5(Cg/C)-k2](\Delta d/d) \quad \text{(Equation 7)}.$$

Figure 14:
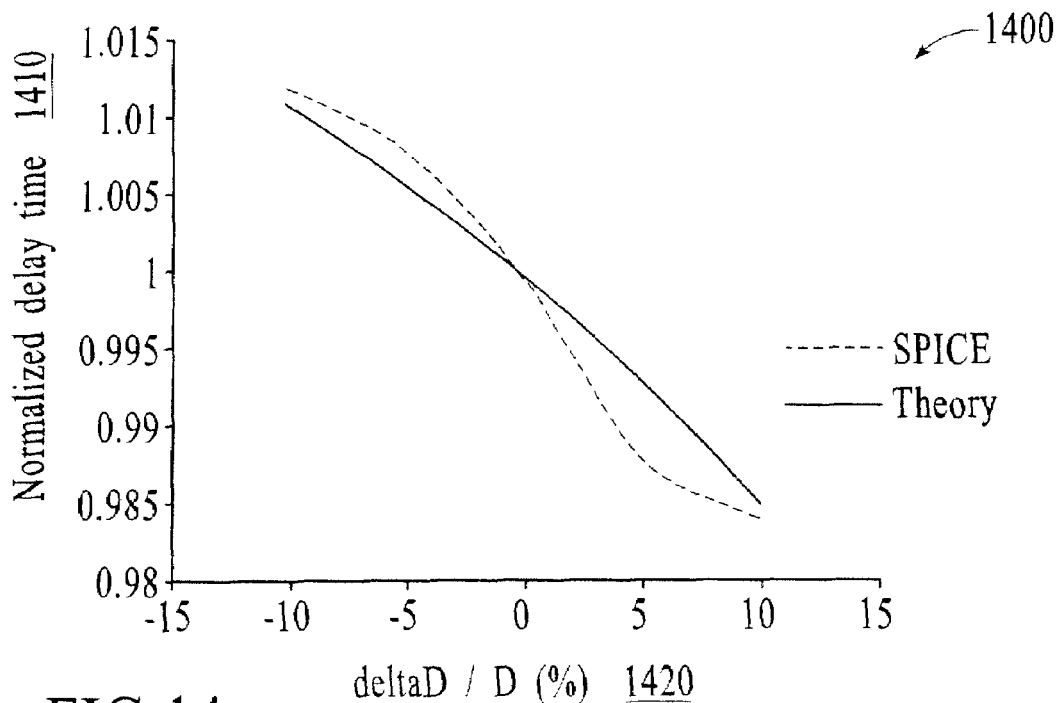
FIG. 14 is a plot of timing delays (normalized) versus interconnect perturbations Δd (as a percentage of dimension d) of an IDMP interconnect model, under an embodiment.

A comparison of solutions resulting from Equation 6 and Equation 7 along with circuit simulations shows that the relationship between timing variations $\Delta\tau$ (normalized) and perturbations $\Delta d$ in metal line dimension d (as a percentage of dimension d) are approximately linear. FIG. 14 is a plot 1400 of timing delays (normalized) 1410 versus interconnect perturbations $\Delta d$ (as a percentage of dimension d) 1420, under an embodiment.

Equations 1-7 above are presented as one example of a set of functions used in the delta flow of an embodiment to describe relationships between delta-geometry, delta-timing, delta-capacitance, delta-resistance, and delta-inductance. However, many different functions (e.g., higher order functions) and different combinations of functions may be developed for use in alternative embodiments under the descriptions herein.

Figure 15A:
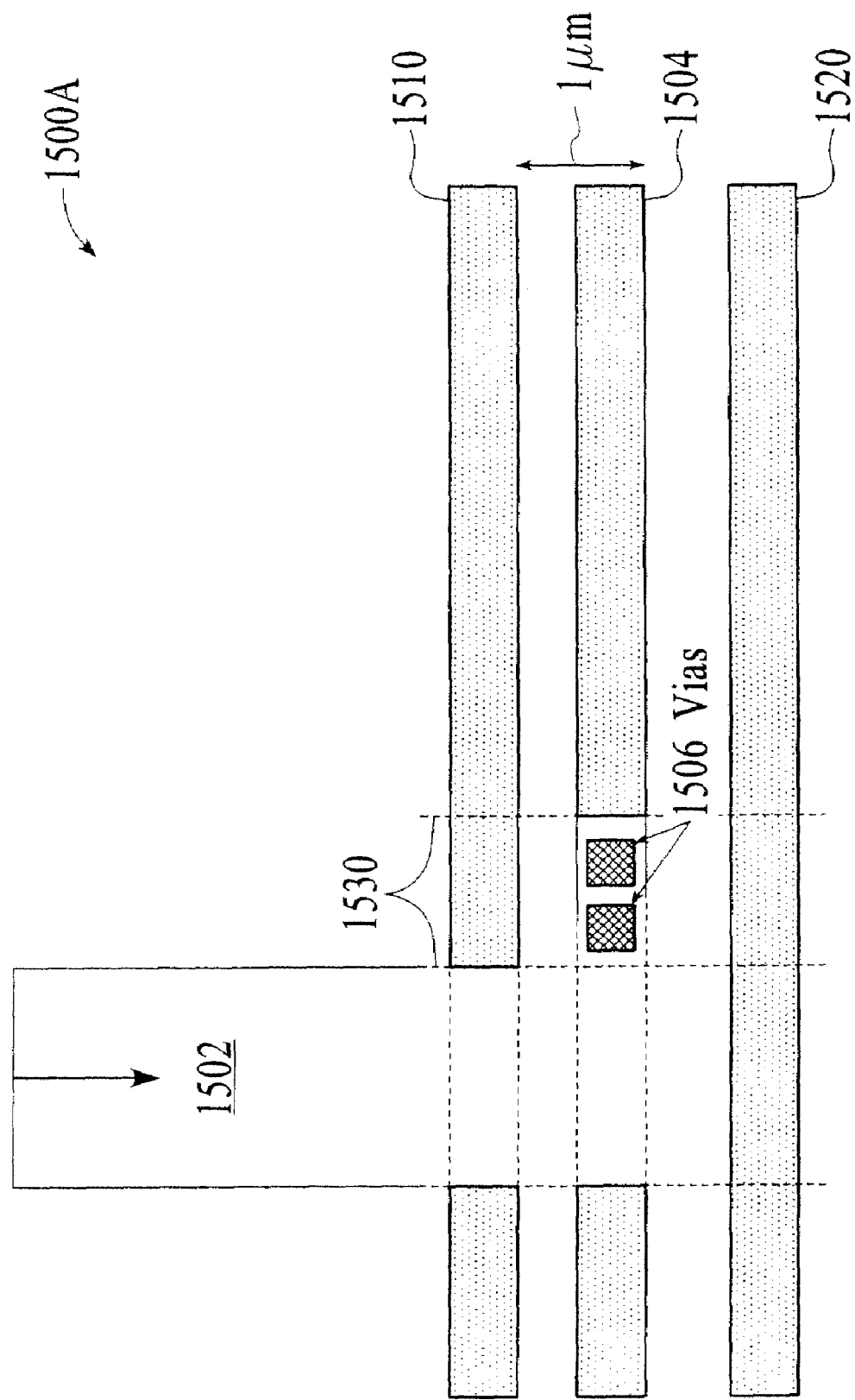
FIGS. 15A, 15B, and 15C show an interconnect structure undergoing delta parameter extraction, under an embodiment.
Figure 15B:
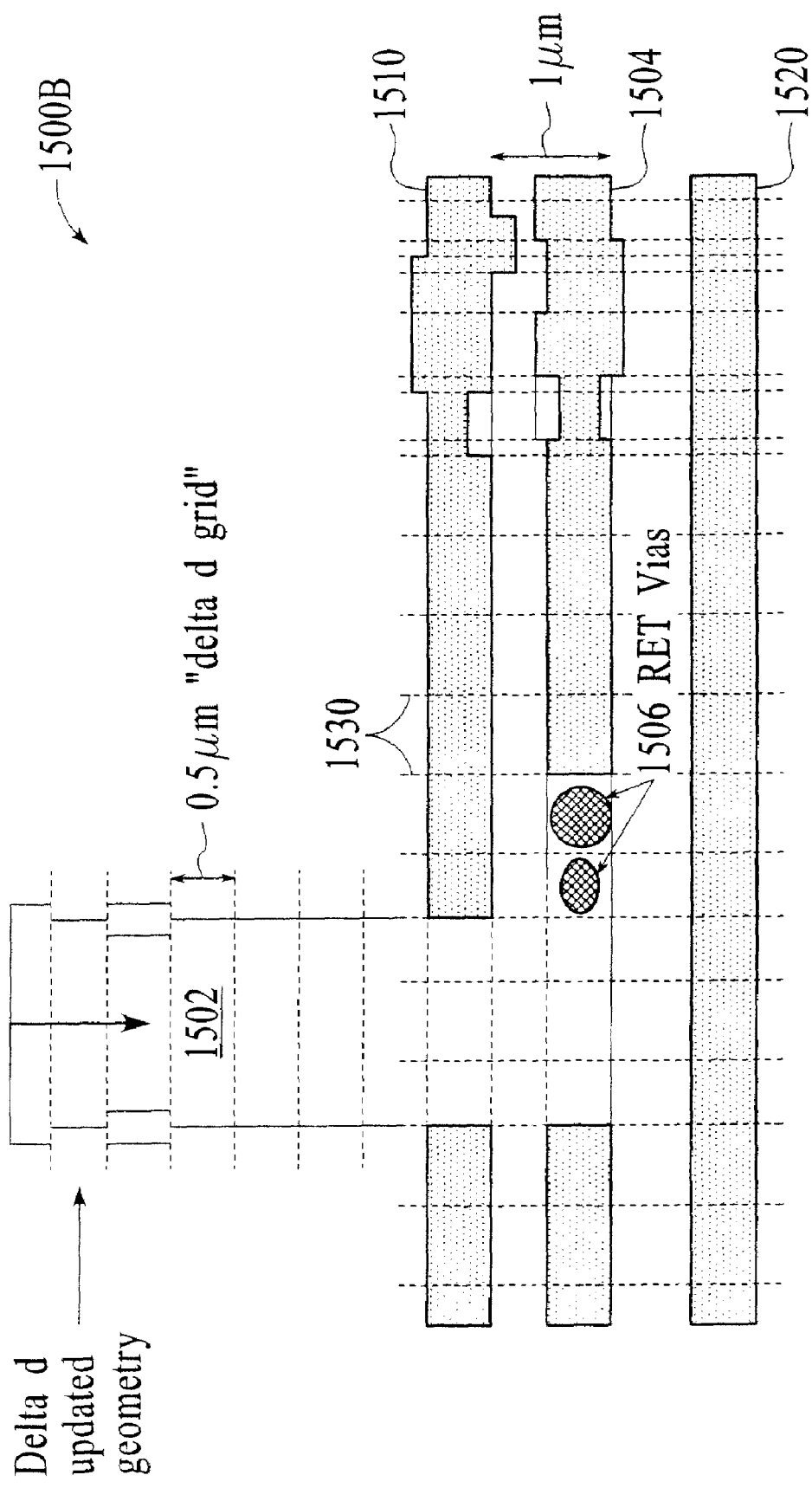
Figure 15C:
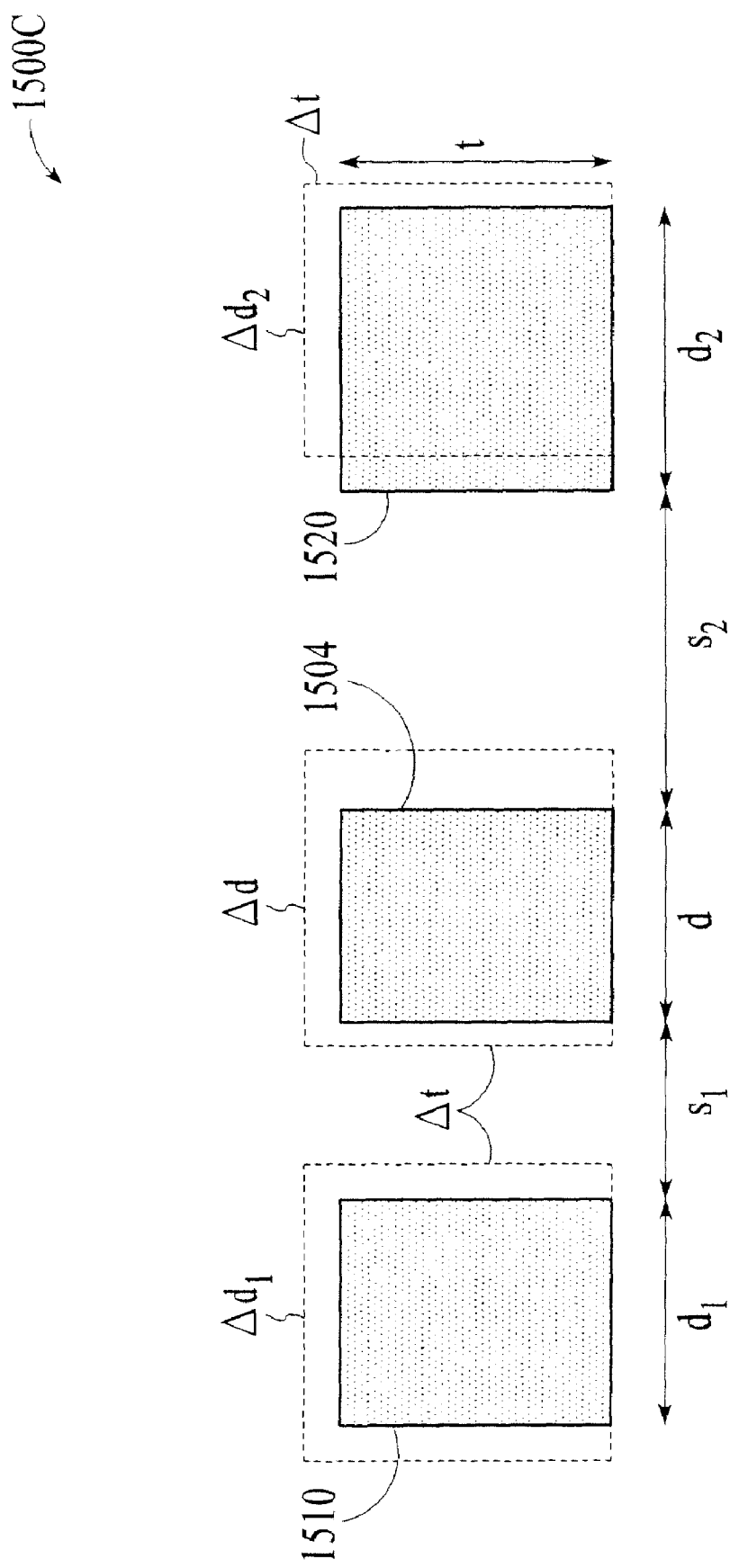

FIGS. 15A, 15B, and 15C show an interconnect structure 1500 undergoing delta parameter extraction, under an embodiment. The interconnect structure 1500A includes a metal power grid 1502 connected to a metal power supply wire 1504 using two vias 1506. The power supply wire 1504 has a dimension "d" and a thickness dimension "t". The power supply wire 1504 has first 1510 and second 1520 neighbor structures in the same layer of the chip. The first structure 1510 has a dimension "d1" and a thickness dimension "t", and is separated from the power supply wire 1504 by distance "s1". The second structure 1520 has a dimension "d2" and a thickness dimension "t", and is separated from the power supply wire 1504 by distance "s2".

FIG. 15A shows the interconnect structure 1500A prior to delta parameter extraction. Prior to the delta parameter extraction process the interconnect structure 1500A includes approximately ten (10) sub-nodes or change areas 1530.

FIG. 15B shows the interconnect structure 1500B following updating of the interconnect geometry with delta geometry information, under an embodiment. Following the geometry update with delta geometry information, the interconnect structure 1500B includes approximately forty (40) sub-nodes or change areas 1530.

FIG. 15C shows an end-view of the interconnect structure 1500C (end view of interconnect structures 1500A/1500B) with the dimensional parameters and corresponding delta geometry for use in delta capacitance extraction, under an embodiment. The InTime interconnect processes described above extract the delta capacitances in accordance with $$\Delta C = (\partial C/\partial d)\Delta d + (\partial C/\partial s1)\Delta s1 + (\partial C/\partial d1)\Delta d1 + (\partial C/\partial s2)\Delta s2 + (\partial C/\partial d2)\Delta d2 + (\partial C/\partial t)\Delta t \quad \text{(Equation 8)}$$

and $$\Delta C = C(d+\Delta d, s1+\Delta s1, d1+\Delta d1, s2+\Delta s2, d2+\Delta d2) - C(d,s1,d1,s2,d2) \quad \text{(Equation 9)}.$$

Equations 8 and 9 are presented as one example of delta-capacitance extraction of an embodiment. Other delta information (e.g., delta-resistance, delta-inductance) may be extracted and different functions (e.g., higher order functions) and different combinations of functions may be developed under the descriptions herein.

Analysis of the interconnect structure 1500 above shows a significant increase in the amount of information required to be processed by the IC design process as delta-geometry information is applied to the interconnect. This increased amount of information can have a significant adverse impact on the efficiency of the typical IC design process because the typical design flow must re-processes all information of the IC design to produce new design characterization parameters that incorporate the delta information.

In contrast to the typical IC design flow, the delta flow of an embodiment (including the InTime and/or InTent processes) introduces an incremental flow that re-characterizes an IC design using delta information corresponding to characterization parameters of the design. The delta flow provides delta outputs (incremental) that enhance or re-characterize corresponding parameters of the devices and interconnect structures without the need to generate new design characterization parameters and without the need to re-process all information of the IC design. By providing the delta information output separately from the original information of the parameters with which the delta output is associated, the delta flow reduces dependency of the design process on library information by efficiently providing accurate delta information of particular circuit parameters. The reduced dependency on library information increases the efficiency and speed of the IC design process because it reduces (or eliminates) the number of lookup operations that are to be performed during the design process. The reduced dependency on library information also increases the accuracy of the IC design because of data quality issues inherent in the library information. Furthermore, the delta information allows for incremental processing of only difference information associated with a parameter instead of re-processing the entire circuit after substituting one or more parameters with new parameters, thereby increasing efficiency, speed and accuracy of the IC design process.

The interconnect modeling described above allows for extraction of one or more of delta-capacitance $\Delta C$, delta-resistance $\Delta R$, and/or delta-inductance $\Delta L$ of each interconnect or interconnect segment of the layout from information of the delta-geometry $\Delta d/\Delta t$ corresponding to each interconnect, as described herein. The delta information $\Delta C$, $\Delta R$, and/or $\Delta L$ are also referred to as "enhanced characterization parameters" or "enhanced electrical parameters" of a modified interconnect. The enhanced characterization parameters include one or more of capacitive, resistive, and inductive parameters that electrically model the modified interconnect. The enhanced characterization parameters can include new values of capacitance, resistance, and/or inductance for the modified interconnects. The modified characterization parameters can also include delta information $\Delta C/\Delta R/\Delta L$ for use in modifying the original characterization parameters of the interconnect to produce new values of capacitance, resistance, and/or inductance for the modified interconnects.

As described with reference to FIG. 2 and FIG. 3, the InTime process 102 or other component processes of the IDMP extracts the delta information $\Delta C$, $\Delta R$, and/or $\Delta L$ (or other parameters as appropriate to the extraction process) from the corresponding delta-geometry $\Delta d/\Delta t$ as appropriate to each interconnect. Either a direct calculation extraction process or an extrapolation extraction process may be used to extract the delta information $\Delta C$, $\Delta R$, and/or $\Delta L$, as described below, but the embodiment is not so limited as alternative embodiments may use other extraction processes.

The direct calculation extraction process reduces or eliminates dependencies of the IC fabrication process on cell or library information by providing for direct calculations of delta-parameter information $\Delta C/\Delta R/\Delta L$ and/or delta-timing $\Delta\tau$ information from delta-geometry $\Delta d/\Delta t$ information. Under the direct calculation extraction process, the IDMP forms one or more relationships or functions between the delta-geometry $\Delta d/\Delta t$ and at least one of the delta information $\Delta C$, $\Delta R$, and/or $\Delta L$. The InTime process 102 for example then directly calculates the delta information $\Delta C$, $\Delta R$, and/or $\Delta L$ for each interconnect from the delta-geometry $\Delta d/\Delta t$ using the relationships described above with reference to Equations 1-7. The InTime process of alternative embodiments may look up the delta information $\Delta C$, $\Delta R$, and/or $\Delta L$ for each interconnect from one or more look-up tables, where the look-up table entries are generated by calculating the delta information $\Delta C$, $\Delta R$, and/or $\Delta L$ for each interconnect from the delta-geometry $\Delta d/\Delta t$ using the relationships of Equations 1-7.

Figure 16:
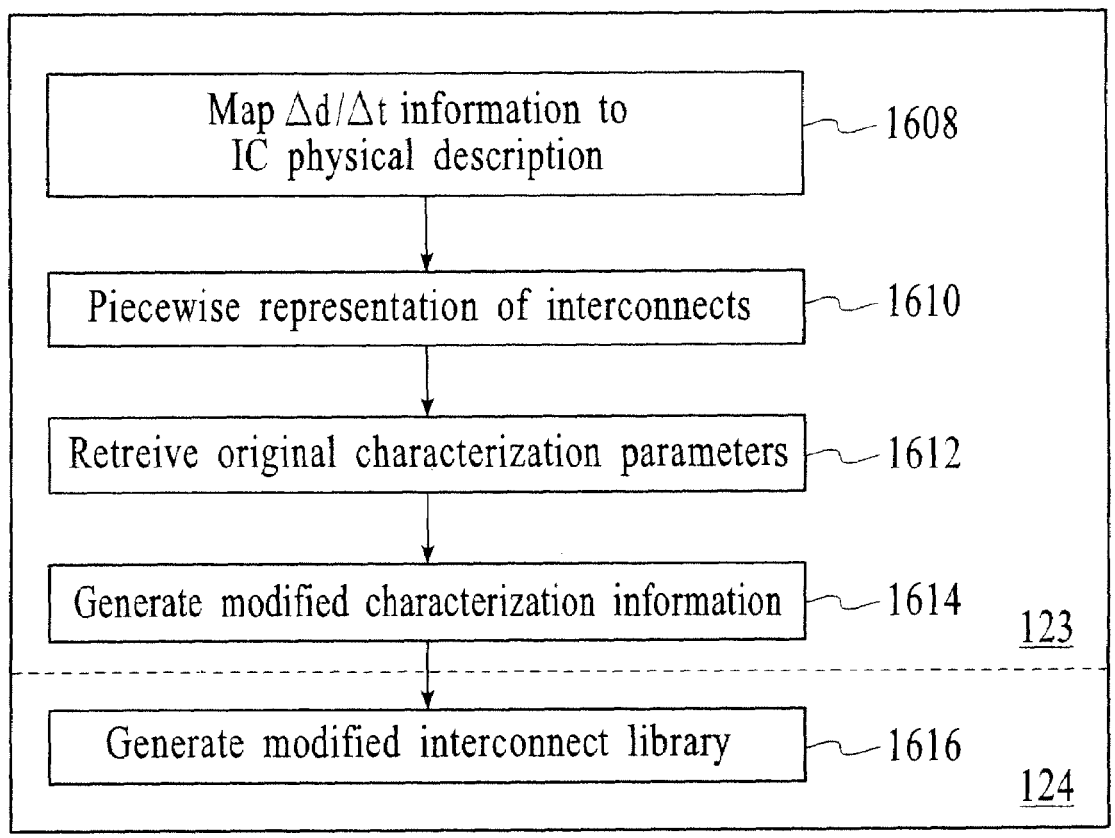
FIG. 16 is a flow diagram of the extrapolation extraction process for extracting information of modified characterization parameters of a modified interconnect, under an embodiment.

In contrast to the direct calculation extraction, the extrapolation extraction process extracts the delta information $\Delta C$, $\Delta R$, and/or $\Delta L$ by extrapolating from interconnect information of the original interconnect library. FIG. 16 is a flow diagram of the extrapolation extraction process 1600 for extracting information of modified characterization parameters of a modified interconnect, under an embodiment. The extrapolation extraction 1600 begins with the InTime process receiving or reading information from a mapping of the delta-geometry $\Delta d/\Delta t$ to a physical description of the IC design layout and identifying interconnects of the layout, at block 1608, and as described above.

The InTime process performs piecewise representation of each interconnect using the delta-geometry $\Delta d/\Delta t$, at block 1610. The piecewise representation can include piecewise polygonization, for example. The piecewise polygonization generally includes sampling points of the design geometry corresponding to interconnects and generating vectors representing the delta-geometry $\Delta d$ of the sampled points. The InTime process translates the vectors to form a polygonized interconnect, also referred to herein as a "$\Delta d$ contour".

Figure 17:
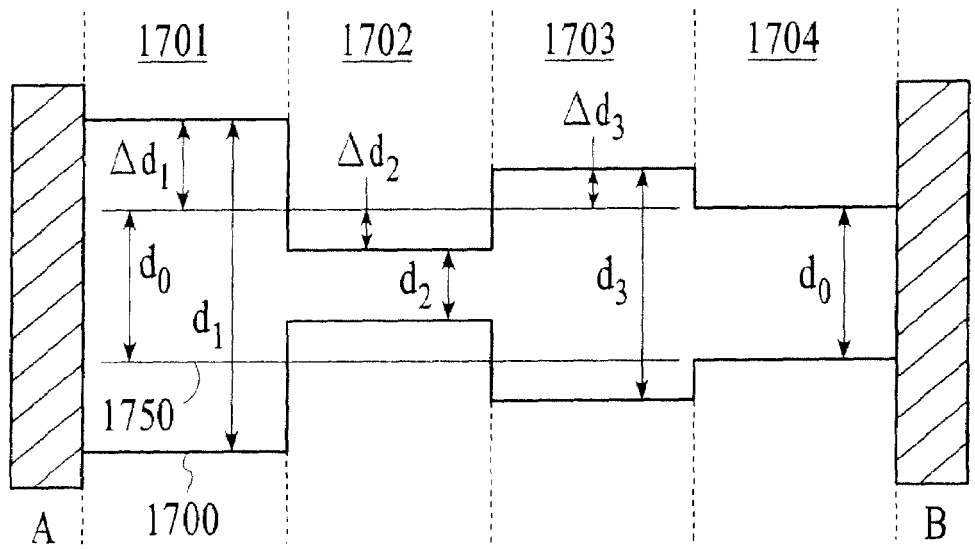
FIG. 17 is a block diagram of polygonized interconnects, under an embodiment.

FIG. 17 is a block diagram of a polygonized interconnect 1700, under an embodiment. The components of the InTime process polygonize the interconnect (defined as the structure between port A and port B) by modifying an original dimension ("DO") of segments or portions of the original (non-polygonized) interconnect 1750 using the dimensional variation $\Delta d$ (vectors) to form new interconnect segments having a new dimension ($\Delta d$ contour).

Taking one interconnect 1700 as an example, the piecewise polygonization begins at a first segment 1701 of the interconnect where the InTime process modifies an original dimension DO of the first segment 1701 by adding a corresponding dimensional variation $+\Delta d1$ to form a new dimension D1 for the segment 1701. Polygonization continues at a second segment 1702 of the interconnect where the InTime process modifies the original dimension DO by subtracting a corresponding dimensional variation −Δd2 to form a new dimension D2 for the segment 1702. Polygonization continues at a third segment 1703 of the interconnect where the InTime process modifies the original dimension DO by adding a corresponding dimensional variation +Δd3 to form a new dimension D3 for the segment 1703. Polygonization ends at a final segment 1704 of the interconnect where the InTime process does not modify the original dimension DO because the dimensional variation has a value of zero (0).

Upon completing polygonization of the interconnect, at block 1610, (returning to FIG. 16) the InTime process retrieves original characterization parameters (capacitance, resistance, and/or inductance) corresponding to one or more original interconnect segments (non-polygonized) from the original interconnect library, at block 1612. The retrieval of the original characterization parameters includes retrieval of the information using one or more look-up tables, for example, but other methods known in the art for retrieving information from a database or other sources may be used in alternative embodiments.

The InTime process uses the original characterization parameters (retrieved) along with information of one or more comparisons between original interconnect segments and modified interconnect segments to generate the modified characterization parameters for use in re-characterizing the new interconnect segment, at block 1614. The comparison of an embodiment includes a comparison between a dimension of an original interconnect segment DO (FIG. 17) with a dimension D1 of the corresponding Δd contour segment. The InTime process uses information of the comparison (difference in the dimensions (DO-D1)) to extrapolate modified characterization parameters (capacitance, resistance, and/or inductance) corresponding to the modified interconnect from the original characterization parameters. The modified parameters are extrapolated and/or interpolated from the original capacitance, resistance, and/or inductance parameters, but alternative embodiments may use additional and/or alternative information of the original interconnect to derive/extrapolate the new parameters.

The InTime process generates a modified interconnect library, at block 1616. Generation of the modified interconnect library includes enhancing information of the original interconnect library by modifying information of interconnect models with the modified interconnect parameters. Modification of the interconnect library models can include appending information of the delta information ΔC/ΔR/ΔL to one or more netlists. Modification of the interconnect library models may also or alternatively include replacing information of one or more netlists with new information that includes the delta information ΔC/ΔR/ΔL. As a further alternative, modification of the interconnect library models may also or alternatively include replacing information of one or more netlists with new values of capacitance, resistance, and/or inductance as appropriate to the modified interconnects.

As described above, the delta flow process including the InTime and/or InTent processes reduces or eliminates dependencies of the IC fabrication process on cell or library information by providing for direct determination or calculation of characterization parameters (delta information) from delta-geometry Δd/Δt information. While this allows for use of direct calculation extractions instead of extrapolation extractions at various points in the design/manufacturing flow, EDA and/or other design-to-manufacturing systems of various alternative embodiments may include extraction processes that use directly-calculated delta information and/or extrapolation extraction processes in which some components of the process use directly-calculated delta information instead of information retrieved via look up processes.

Referring to FIGS. 1, 2, 3, 5, 6, and 16, the operations of the processes are under control of at least one processor, but are not so limited. Those skilled in the relevant art can create source code, microcode, program logic arrays or otherwise implement the invention based on these flow diagrams and the detailed description provided herein. The algorithm or routine operating according to these flow diagrams is stored in non-volatile memory that forms part of the associated processors, in the associated memory areas, in removable media, such as disks, or hardwired or preprogrammed in chips, such as electronically erasable programmable ROM ("EEPROM") semiconductor chips, or in any combination of these components, but is not so limited.

Aspects of the IDMP, described above, are described in terms of processes executed on an EDA computer system or other processing system. These processes are implemented as program code stored in machine-readable or computer-readable memory areas or devices of a computer system and are executed by the processor of the computer system.

Figure 18:
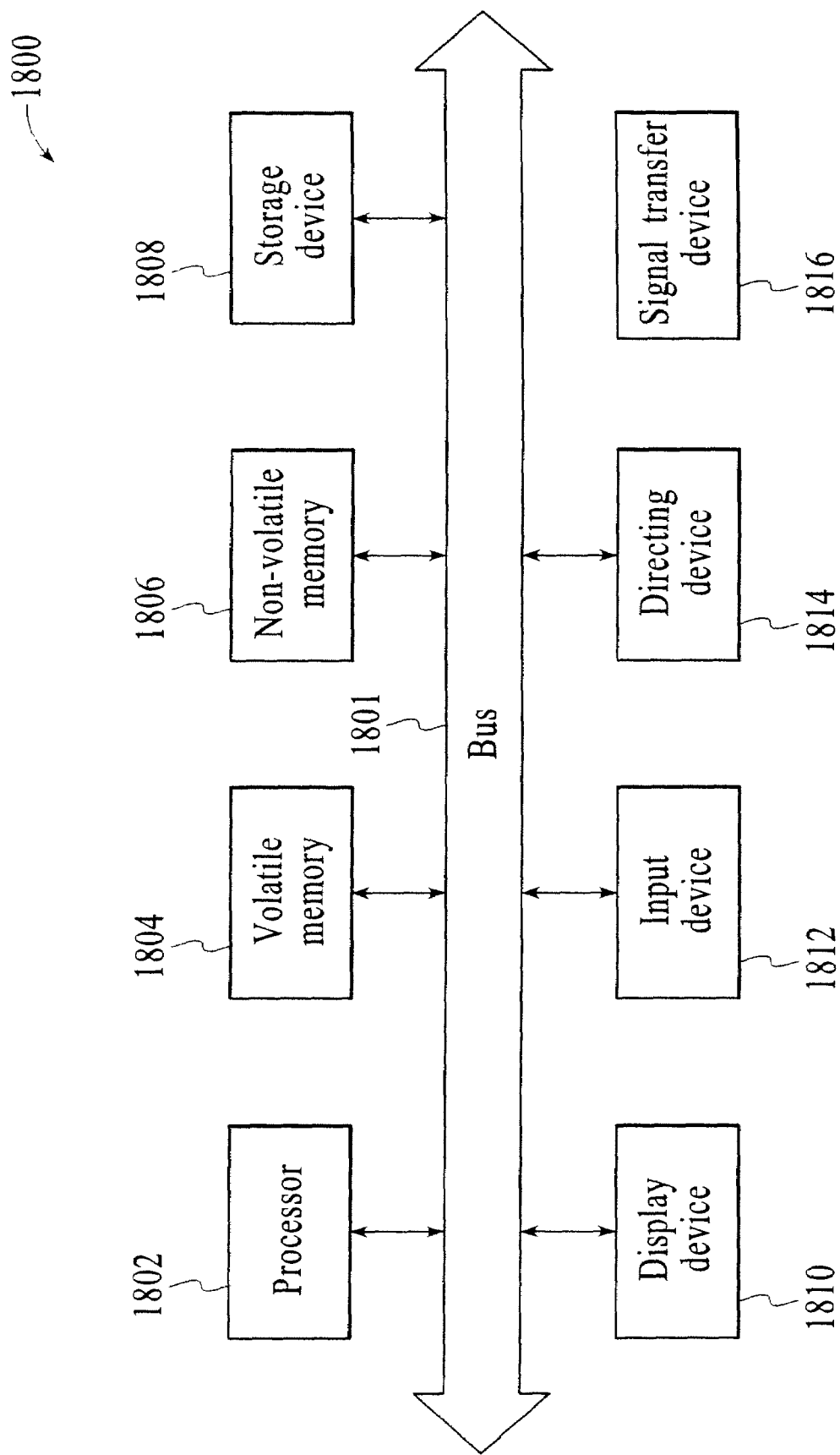
FIG. 18 is a computer system hosting the IDMP, under an embodiment.

Although a variety of different computer systems can be used with the IDMP, FIG. 18 is a computer system 1800 hosting the IDMP that includes delta-geometry timing prediction processes (InTime) and delta-timing shape prediction processes (InTent), under an embodiment. The computer system 1800 generally includes a central processor unit ("CPU") or central processor 1802 for processing information and instructions, an address/data bus 1801 coupled to the CPU 1802 for communicating information, volatile memory 1804 (random access memory ("RAM") for example) coupled to the bus 1801 for storing information and instructions for the CPU 1802, and non-volatile memory 1806 (read-only memory ("ROM") for example) coupled to the bus 1801 for storing static information and instructions for the CPU 1802. The computer system 1800 may also include one or more optional storage devices 1808 coupled to the bus 1801 for storing information and instructions. The storage devices or data storage devices 1808 can include one or more removable magnetic or optical storage media which are computer-readable memories. Some combination of the volatile memory 1804, non-volatile memory 1806, and/or storage device 1808 include or store data structures describing components or processes of the IDMP described above, but the IDMP is not limited to storage in these devices.

The computer system 1800 may also include at least one optional display device 1810 coupled to the bus 1801 for displaying information to the users of the computer system 1800. The computer system 1800 of an embodiment may also include one or more optional input devices 1812 coupled to the bus 1801 for communicating information and command selections to the CPU 1802. Additionally, the computer system 1800 may include an optional cursor control or directing device 1814 coupled to the bus 1801 for communicating user input information and command selections to the CPU 1802. The computer system 1800 may also include one or more optional signal transfer devices 1816 (transmitter, receiver, modem, etc. for example) coupled to the bus 1801 for interfacing with other computer systems.

The systems and methods for fabricating ICs described herein include a method comprising directly generating incremental delta-parameters corresponding to at least one interconnect of a received circuit design using one or more functional relationships between the delta-parameters and at least one dimensional variation of the interconnect, wherein the delta-parameters include difference information of one or more electrical parameters that characterize the interconnect.

The systems and methods for fabricating ICs described herein include a method comprising directly generating incremental delta-parameters corresponding to at least one interconnect of a received circuit design using information of at least one dimensional variation of the interconnect and pre-specified information of one or more electrical parameters that characterize the interconnect, wherein the delta-parameters include difference information of the electrical parameters that characterize the interconnect.

The systems and methods for fabricating ICs described herein include a method comprising directly generating incremental delta-parameters corresponding to at least one device of a received circuit design using one or more functional relationships between the delta-parameters and at least one dimensional variation of the device, wherein the delta-parameters include difference information of one or more electrical parameters that characterize the device.

The systems and methods for fabricating ICs described herein include a method comprising directly generating incremental delta-parameters corresponding to at least one device of a received circuit design using information of at least one dimensional variation of the device and pre-specified information of one or more electrical parameters that characterize the device, wherein the delta-parameters include difference information of the electrical parameters that characterize the device.

The systems and methods for fabricating ICs described herein include a method comprising at least one of receiving a circuit design that includes a plurality of devices and interconnects, predicting at least one of incremental delta-parameters and incremental timing differences of the circuit design using dimensional differences corresponding to the circuit design, wherein the delta-parameters include difference information of one or more parameters that characterize at least one of the devices and the interconnects, predicting dimensional differences of the circuit design using the incremental timing differences, and modifying the circuit design by integrating at least one of the dimensional differences, the incremental delta-parameters, and the incremental timing differences in the circuit design.

The method of an embodiment further comprises generating a model of the circuit design using at least one of the dimensional differences, the incremental delta-parameters, and the timing differences.

The method of an embodiment further comprises enhancing information of models of at least one of the devices and interconnects using at least one of the dimensional differences, the delta-parameters, and the timing differences.

The method of an embodiment further comprises appending at least one of the dimensional differences, the delta-parameters, and the timing differences to one or more circuit description corresponding to the circuit, wherein the circuit description is at least one of a graphical data representation and a text-file representation The method of an embodiment further comprises replacing information of one or more circuit description corresponding to the circuit with information that includes at least one of the dimensional differences, the delta-parameters, and the timing differences.

The method of an embodiment further comprises re-characterizing at least one of the devices and interconnects using at least one of the dimensional differences, the delta-parameters, and the timing differences.

The predicting of the method of an embodiment further comprises extracting the incremental delta-parameters of at least one of the devices and the interconnects using the dimensional differences. The extracting of an embodiment comprises mapping the dimensional differences to the circuit design. The extracting of an embodiment further comprises at least one of forming one or more functional relationships between the dimensional differences and the delta-parameters and generating the delta-parameters directly from the dimensional differences using the functional relationships.

The incremental delta-parameters of the method of an embodiment include incremental differences in circuit parameters that characterize at least one of each device, each interconnect, and one or more segments of each interconnect.

The circuit parameters of the method of an embodiment include at least one of resistance, inductance, capacitance, junction capacitance, gate-to-source capacitance, gate-to-drain capacitance, source-to-substrate capacitance, gate-to-substrate capacitance, drain-to-substrate capacitance, and effective gate length.

The predicting of the dimensional differences of the method of an embodiment further comprises at least one of determining slack delay times using the incremental timing differences and partitioning the slack delay times among the devices and interconnects. The method of an embodiment further comprises generating the incremental delta-parameters corresponding to at least one of the devices and interconnects using the partitioned slack delay times.

The modifying of the circuit design of the method of an embodiment further comprises generating rules of the dimensional differences using the predicted incremental delta-parameters.

The incremental timing differences of the method of an embodiment include signal propagation delays of the circuit.

The method of an embodiment further comprises deriving the dimensional differences from information of a geometry verification analysis of the circuit.

Integrating at least one of the dimensional differences, the incremental delta-parameters, and the incremental timing differences of the method of an embodiment comprises mapping at least one of the dimensional differences, the incremental delta-parameters, and the incremental timing differences to a physical description of the circuit. The physical description of the method of an embodiment is at least one of a graphical data representation and a text-file representation.

The systems and methods for fabricating ICs described herein include a method comprising at least one of receiving a circuit design that includes a plurality of devices and interconnects, receiving dimensional differences corresponding to the devices and interconnects, extracting incremental delta-parameters of the devices and the interconnects using the dimensional differences, wherein the delta-parameters include difference information of one or more parameters that characterize at least one of the devices and the interconnects, generating incremental timing differences of the design using at least one of the dimensional differences and the delta-parameters, and generating delta-parameters corresponding to the design using the timing differences.

The systems and methods for fabricating ICs described herein include an integrated design-manufacturing method comprising at least one of receiving a design of an IC that includes a plurality of devices and interconnects, performing incremental modification of device models and interconnect models using dimensional variations of the devices and dimensional variations of the interconnects, modeling the IC using the modified device and interconnect models, generating timing variation information of the IC using the model, generating device variations and interconnect variations using the timing variation information, and generating rules for the dimensional variations of the devices and the dimensional variations of the interconnects using the generated device variations and interconnect variations.

The systems and methods for fabricating ICs described herein include an integrated design-manufacturing method comprising at least one of receiving a design of an IC that includes a plurality of devices and interconnects, generating a circuit model of the design using information of enhanced device and interconnect models, the enhanced device and interconnect models integrating at least one of capacitive variations, resistive variations, and inductive variations derived from dimensional variations of the devices and interconnects, generating timing variation information using the circuit model, and generating rules for control of the dimensional variations of the devices and interconnects using the timing variation information, the rules integrating at least one of capacitive variations, resistive variations, and inductive variations derived from the timing variation information of the circuit model.

The systems and methods for fabricating ICs described herein include a system comprising at least one of means for electronically processing and means for electronically storing information, means for receiving a circuit design that includes a plurality of devices and interconnects, means for predicting at least one of incremental delta-parameters and incremental timing differences of the circuit design using dimensional differences corresponding to the circuit design, wherein the delta-parameters include difference information of one or more parameters that characterize at least one of the devices and the interconnects, means for predicting dimensional differences of the circuit design using the incremental timing differences, and means for modifying the circuit design by integrating at least one of the dimensional differences, the incremental delta-parameters, and the incremental timing differences in the circuit design.

The system of an embodiment further comprises means for generating a model of the circuit design using at least one of the dimensional differences, the incremental delta-parameters, and the timing differences.

The system of an embodiment further comprises means for enhancing information of models of at least one of the devices and interconnects using at least one of the dimensional differences, the delta-parameters, and the timing differences.

The system of an embodiment further comprises means for appending at least one of the dimensional differences, the delta-parameters, and the timing differences to one or more circuit description corresponding to the circuit, wherein the circuit description is at least one of a graphical data representation and a text-file representation The system of an embodiment further comprises means for re-characterizing at least one of the devices and interconnects using at least one of the dimensional differences, the delta-parameters, and the timing differences.

The means for predicting of the system of an embodiment further comprises means for extracting the incremental delta-parameters using the dimensional differences.

The incremental delta-parameters of the system of an embodiment include incremental differences in circuit parameters that characterize at least one of each device, each interconnect, and one or more segments of each interconnect.

The circuit parameters of the system of an embodiment include at least one of resistance, inductance, capacitance, gate-to-source capacitance, gate-to-drain capacitance, source-to-substrate capacitance, gate-to-substrate capacitance, and drain-to-substrate capacitance.

The means for predicting the dimensional differences of the system of an embodiment further comprises means for determining slack delay times using the incremental timing differences. The means for predicting the dimensional differences of the system of an embodiment further comprises means for partitioning the slack delay times. The system of an embodiment further comprises means for generating the dimensional differences using the partitioned slack delay times.

The means for modifying the circuit design of the system of an embodiment further comprises means for generating rules of the dimensional differences using the predicted incremental delta-parameters.

The system of an embodiment further comprises means for deriving the dimensional differences from information of a geometry verification analysis of the circuit design.

The means for modifying of the system of an embodiment further comprises mapping at least one of the dimensional differences, the incremental delta-parameters, and the incremental timing differences to a physical description of the circuit.

The systems and methods for fabricating ICs described herein include a device comprising at least one of means for receiving a circuit design that includes a plurality of devices and interconnects, means for predicting at least one of incremental delta-parameters and incremental timing differences of the circuit design using dimensional differences corresponding to the circuit design, wherein the delta-parameters include difference information of one or more parameters that characterize at least one of the devices and the interconnects, means for predicting dimensional differences of the circuit design using the incremental timing differences, and means for modifying the circuit design by integrating at least one of the dimensional differences, the incremental delta-parameters, and the incremental timing differences in the circuit design.

The systems and methods for fabricating ICs described herein include machine readable medium including executable instructions which when executed by a processing system receive a circuit design that includes a plurality of devices and interconnects, predict at least one of incremental delta-parameters and incremental timing differences of the circuit design using dimensional differences corresponding to the circuit design, wherein the delta-parameters include difference information of one or more parameters that characterize at least one of the devices and the interconnects, predict dimensional differences of the circuit design using the incremental timing differences, and/or modify the circuit design by integrating at least one of the dimensional differences, the incremental delta-parameters, and the incremental timing differences in the circuit design.

The systems and methods for fabricating ICs described herein include a method comprising at least one of receiving a circuit layout that includes a plurality of devices and interconnects, receiving dimensional differences corresponding to the devices and interconnects, extracting incremental delta-parameters of at least one of the devices and the interconnects using the dimensional differences, wherein the delta-parameters include difference information of one or more parameters that characterize at least one of the devices and the interconnects, and predicting incremental timing differences of at least one of the devices and interconnects using at least one of the dimensional differences and the delta-parameters.

The method of an embodiment further comprises generating a model of the circuit using at least one of the dimensional differences, the incremental delta-parameters, and the timing differences.

Extracting incremental delta-parameters of an embodiment comprises mapping the dimensional differences to the circuit layout.

The method of an embodiment further comprises enhancing information of models of at least one of the devices and interconnects using at least one of the dimensional differences, the delta-parameters, and the timing differences.

The method of an embodiment further comprises appending at least one of the dimensional differences, the delta-parameters, and the timing differences to one or more circuit description corresponding to the circuit, wherein the circuit description is at least one of a graphical data representation and a text-file representation The method of an embodiment further comprises replacing information of one or more netlists corresponding to the circuit with information that includes at least one of the dimensional differences, the delta-parameters, and the timing differences.

The method of an embodiment further comprises re-characterizing at least one of the devices and interconnects using at least one of the dimensional differences, the delta-parameters, and the timing differences.

Extracting incremental delta-parameters of an embodiment further comprises forming one or more functional relationships between the dimensional differences and the delta-parameters and/or generating the delta-parameters directly from the dimensional differences using the functional relationships.

The incremental delta-parameters of the interconnects of an embodiment include incremental differences in circuit parameters that characterize at least one of each interconnect and one or more segments of each interconnect.

The parameters of an embodiment include at least one of capacitance, resistance, and inductance.

The method of an embodiment further comprises determining slack delay times from the incremental timing differences and/or partitioning the slack delay times among the devices and interconnects. The method of an embodiment further comprises generating the incremental delta-parameters corresponding to at least one of the devices using the partitioned slack delay times. The method of an embodiment further comprises generating the incremental delta-parameters corresponding to at least one of the interconnects using the partitioned slack delay times. The method of an embodiment further comprises generating rules for control of the dimensional differences using the generated incremental delta-parameters.

The systems and methods for fabricating ICs described herein include a method comprising at least one of receiving a circuit design that includes a plurality of devices and interconnects, integrating dimensional differences of at least one of the devices and the interconnects into the design, extracting incremental delta-parameters of at least one of the devices and the interconnects using the dimensional differences, wherein the delta-parameters include difference information of one or more electrical parameters that characterize at least one of the devices and the interconnects, and performing timing analysis using the incremental delta-parameter information and generating incremental timing differences.

The method of an embodiment further comprises generating timing reports including the incremental timing differences.

The method of an embodiment further comprises generating a model of the circuit using at least one of the dimensional differences and the incremental delta-parameters.

The incremental timing differences of an embodiment include signal propagation delays of the circuit.

The method of an embodiment further comprises deriving the dimensional differences from information of a geometry verification analysis of the circuit.

Integrating dimensional differences of an embodiment comprises mapping the dimensional differences to a physical description of the circuit.

The physical description of an embodiment is at least one of a graphical data representation and a text-file representation.

The method of an embodiment further comprises enhancing information of models of at least one of the devices and interconnects using at least one of the dimensional differences, the delta-parameters, and the timing differences. Enhancing information of the device models of an embodiment includes appending at least one of the dimensional differences, the delta-parameters, and the timing differences to one or more netlists. Enhancing information of the device models of an embodiment includes replacing information of one or more netlists with new information that includes at least one of the dimensional differences, the delta-parameters, and the timing differences. Enhancing information of the interconnects of an embodiment comprises re-characterizing the interconnects using at least one of the dimensional differences, the delta-parameters, and the timing differences.

Extracting incremental delta-parameters of an embodiment further comprises forming one or more functional relationships between the dimensional differences and the delta-parameters and/or determining differences in parameters that characterize at least one of the devices and interconnects directly from the dimensional differences using the functional relationships.

Extracting incremental delta-parameters of an embodiment further comprises identifying one or more parameters that characterize at least one of the devices and interconnects and/or forming the delta-parameters of the devices and interconnects using one or more interpolation operations along with the identified parameters that characterize at least one of the devices and interconnects.

The incremental delta-parameters of the interconnects of an embodiment include incremental differences in circuit parameters that characterize at least one of each interconnect and one or more segments of each interconnect.

The electrical parameters of an embodiment include at least one of capacitance, resistance, and inductance.

The electrical parameters of the devices of an embodiment include at least one of gate-to-source capacitance, gate-to-drain capacitance, source-to-substrate capacitance, gate-to-substrate capacitance, and drain-to-substrate capacitance.

The systems and methods for fabricating ICs described herein include an integrated design-manufacturing method comprising at least one of receiving a design of an IC that includes a plurality of devices and interconnects, performing incremental modification of device models using dimensional variations of the devices, performing incremental modification of interconnect models using dimensional variations of the interconnects, generating a model of the IC using the modified device and interconnect models, generating signal propagation delay information of the model, and verifying geometry of the model using the signal propagation delay information.

The method of an embodiment further comprises partitioning slack delay times among the devices and interconnects of the IC, wherein the signal propagation delay information includes the slack delay times, generating device variations using the partitioned slack delay times, generating interconnect variations using the partitioned slack delay times, and/or generating rules for control of the dimensional variations of the devices and the dimensional variations of the interconnects using the generated device variations and interconnect variations.

The device variations of an embodiment include at least one of incremental dimensional differences and incremental differences in circuit parameters that characterize each device.

The interconnect variations of an embodiment include incremental dimensional differences.

The interconnect variations of an embodiment include incremental differences in circuit parameters that characterize at least one of each interconnect and one or more segments of each interconnect. The interconnect variations of an embodiment may include at least one of capacitive variations, resistive variations, and inductive variations.

The systems and methods for fabricating ICs described herein include a system comprising at least one of means for electronically processing and means for electronically storing information, means for receiving a circuit layout that includes a plurality of devices and interconnects, means for receiving dimensional differences corresponding to the devices and interconnects, means for extracting incremental delta-parameters of at least one of the devices and the interconnects using the dimensional differences, wherein the delta-parameters include difference information of one or more parameters that characterize at least one of the devices and the interconnects, and means for predicting incremental timing differences of at least one of the devices and interconnects using at least one of the dimensional differences and the delta-parameters.

The system of an embodiment further comprises means for generating a model of the circuit using at least one of the dimensional differences, the incremental delta-parameters, and the timing differences.

The system of an embodiment further comprises means for mapping the dimensional differences to the circuit layout.

The system of an embodiment further comprises means for enhancing information of models of at least one of the devices and interconnects using at least one of the dimensional differences, the delta-parameters, and the timing differences.

The system of an embodiment further comprises means for appending at least one of the dimensional differences, the delta-parameters, and the timing differences to one or more netlists corresponding to the circuit.

The system of an embodiment further comprises means for replacing information of one or more netlists corresponding to the circuit with information that includes at least one of the dimensional differences, the delta-parameters, and the timing differences.

The system of an embodiment further comprises means for re-characterizing at least one of the devices and interconnects using at least one of the dimensional differences, the delta-parameters, and the timing differences.

The system of an embodiment further comprises means for determining slack delay times from the incremental timing differences and/or means for partitioning the slack delay times among the devices and interconnects.

The system of an embodiment further comprises means for generating the incremental delta-parameters corresponding to at least one of the devices using the partitioned slack delay times.

The system of an embodiment further comprises means for generating the incremental delta-parameters corresponding to at least one of the interconnects using the partitioned slack delay times.

The system of an embodiment further comprises means for generating rules for control of the dimensional differences using the generated incremental delta-parameters.

The systems and methods for fabricating ICs described herein include a device comprising means for receiving a circuit layout that includes a plurality of devices and interconnects, means for receiving dimensional differences corresponding to the devices and interconnects, means for extracting incremental delta-parameters of at least one of the devices and the interconnects using the dimensional differences, wherein the delta-parameters include difference information of one or more parameters that characterize at least one of the devices and the interconnects, and/or means for predicting incremental timing differences of at least one of the devices and interconnects using at least one of the dimensional differences and the delta-parameters.

The means for extracting of an embodiment comprises means for forming one or more functional relationships between the dimensional differences and the delta-parameters and/or means for generating the delta-parameters directly from the dimensional differences using the functional relationships.

The device of an embodiment further comprises means for generating a model of the circuit using at least one of the dimensional differences, the incremental delta-parameters, and the timing differences.

The device of an embodiment further comprises means for mapping the dimensional differences to the circuit layout.

The device of an embodiment further comprises means for enhancing information of models of at least one of the devices and interconnects using at least one of the dimensional differences, the delta-parameters, and the timing differences.

The systems and methods for fabricating ICs described herein include machine readable medium including executable instructions which when executed by a processing system receive a circuit layout that includes a plurality of devices and interconnects, receive dimensional differences corresponding to the devices and interconnects, extract incremental delta-parameters of at least one of the devices and the interconnects using the dimensional differences, wherein the delta-parameters include difference information of one or more parameters that characterize at least one of the devices and the interconnects, and/or predict incremental timing differences of at least one of the devices and interconnects using at least one of the dimensional differences and the delta-parameters.

Aspects of the systems and methods for fabricating ICs described herein may be implemented as functionality programmed into any of a variety of circuitry, including programmable logic devices (PLDs), such as field programmable gate arrays (FPGAs), programmable array logic (PAL) devices, electrically programmable logic and memory devices and standard cell-based devices, as well as application specific integrated circuits (ASICs). Some other possibilities for implementing aspects of the systems and methods for fabricating ICs include: microcontrollers with memory (such as electronically erasable programmable read only memory (EEPROM)), embedded microprocessors, firmware, software, etc. Furthermore, aspects of the systems and methods for fabricating ICs may be embodied in microprocessors having software-based circuit emulation, discrete logic (sequential and combinatorial), custom devices, fuzzy (neural) logic, quantum devices, and hybrids of any of the above device types. Of course the underlying device technologies may be provided in a variety of component types, e.g., metal-oxide semiconductor field-effect transistor (MOSFET) technologies like complementary metal-oxide semiconductor (CMOS), bipolar technologies like emitter-coupled logic (ECL), polymer technologies (e.g., silicon-conjugated polymer and metal-conjugated polymer-metal structures), mixed analog and digital, etc.

It should be noted that components of the various systems and methods disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages.

Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described systems and methods may be processed by a processing entity (e.g., one or more processors) within the computer system in conjunction with execution of one or more other computer programs including, without limitation, net-list generation programs, place and route programs and the like.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

The above description of illustrated embodiments of the systems and methods for fabricating ICs is not intended to be exhaustive or to limit the systems and methods for fabricating ICs to the precise form disclosed. While specific embodiments of, and examples for, the systems and methods for fabricating ICs are described herein for illustrative purposes, various equivalent modifications are possible within the scope of the systems and methods for fabricating ICs, as those skilled in the relevant art will recognize. The teachings of the systems and methods for fabricating ICs provided herein can be applied to other processing systems and methods, not only for the systems and methods for fabricating ICs described above.

The elements and acts of the various embodiments described above can be combined to provide further embodiments. These and other changes can be made to the systems and methods for fabricating ICs in light of the above detailed description.

In general, in the following claims, the terms used should not be construed to limit the systems and methods for fabricating ICs to the specific embodiments disclosed in the specification and the claims, but should be construed to include all systems and methods that operate under the claims. Accordingly, the systems and methods for fabricating ICs are not limited by the disclosure, but instead the scope of the systems and methods for fabricating ICs are to be determined entirely by the claims.

While certain aspects of the systems and methods for fabricating ICs are presented below in certain claim forms, the inventors contemplate the various aspects of the systems and methods for fabricating ICs in any number of claim forms. For example, while only one aspect of the system is recited as embodied in machine-readable medium, other aspects may likewise be embodied in machine-readable medium. Accordingly, the inventors reserve the right to add additional claims after filing the application to pursue such additional claim forms for other aspects of the systems and methods for fabricating ICs.

What is claimed is:

1. A method of characterizing a circuit design using delta information corresponding to characterization parameters of the circuit design, comprising:
   receiving a circuit design that includes a plurality of cells and interconnects;
   determining delta geometry information for the circuit design;
   calculating incremental timing differences for the circuit design using the determined delta geometry information; and
   evaluating the incremental timing differences against a timing budget to determine slack time in the circuit design; and
   generating dimensional variation rules for the circuit design based on the determined slack time.

2. The method of claim 1, further comprising partitioning the calculated incremental timing differences among the plurality of cells and interconnects of the circuit design.

3. The method of claim 2, further comprising allocating the timing budget among the plurality of the cells and interconnects of the circuit design.

4. The method of claim 3, wherein allocating the timing budget includes allocating difference information relating to IC characterization parameters.

5. The method of claim 2, further comprising partitioning the slack time indicated by the incremental timing differences among a plurality of the cells and interconnects.

6. The method of claim 5, further comprising generating a timing variation database that includes maximum and minimum timing variations associated with the partitioned slack time for the cells and interconnects.

7. The method of claim 6, further comprising deriving delta information for a cell from timing variations corresponding to that cell.

8. The method of claim 1, wherein evaluating the incremental timing differences comprises generating a max/min timing variation database of incremental timing differences, and generating delta characterization information for a cell from timing variations corresponding to each of a plurality of interconnects.

9. The method of claim 1, further comprising generating a report of a source of differences in the circuit design that result in violation of the timing budget.

10. The method of claim 1, wherein generating dimensional variation rules for the circuit design comprises performing shape slack budgeting based on the delta geometry information and the timing budget.

11. The method of claim 1, further comprising generating a delta budgetary assignment corresponding to the cells or interconnects of the circuit design.

12. The method of claim 1, wherein delta geometry information includes at least one of length, width and thickness variation information associated with elements of the circuit design.

13. A computer program product comprising a computer useable medium having computer program code embodied therein for enabling a computing device to characterize a circuit design using delta information corresponding to characterization parameters of the circuit design, the characterization comprising:
    receiving a circuit design that includes a plurality of cells and interconnects;
    determining delta geometry information for the circuit design;
    calculating incremental timing differences for the circuit design using the determined delta geometry information; and
    evaluating the incremental timing differences against a timing budget to determine slack time in the circuit design; and
    generating dimensional variation rules for the circuit design based on the determined slack time.

14. The computer program product of claim 13, further comprising partitioning the calculated incremental timing differences among the plurality of cells and interconnects of the circuit design.

15. The computer program product of claim 14, further comprising allocating the timing budget among the plurality of the cells and interconnects of the circuit design.

16. The computer program product of claim 15, wherein allocating the timing budget includes allocating difference information relating to IC characterization parameters.

17. The computer program product of claim 14, further comprising partitioning the slack time indicated by the incremental timing differences among a plurality of the cells and interconnects.

18. The computer program product of claim 17, further comprising generating a timing variation database that includes maximum and minimum timing variations associated with the partitioned slack time for the cells and interconnects.

19. The computer program product of claim 18, further comprising deriving delta information for a cell from timing variations corresponding to that cell.

20. The computer program product of claim 13, wherein evaluating the incremental timing differences comprises generating a max/min timing variation database of incremental timing differences, and generating delta characterization information for a cell from timing variations corresponding to each of a plurality of interconnects.

21. The computer program product of claim 13, further comprising generating a report of a source of differences in the circuit design that result in violation of the timing budget.

22. The computer program product of claim 13, wherein generating dimensional variation rules for the circuit design comprises performing shape slack budgeting based on the delta geometry information and the timing budget.

23. The computer program product of claim 13, further comprising generating a delta budgetary assignment corresponding to the cells or interconnects of the circuit design.

24. The computer program product of claim 13, wherein delta geometry information includes at least one of length, width and thickness variation information associated with elements of the circuit design.

25. A computing system for characterizing a circuit design using delta information corresponding to characterization parameters of the circuit design, comprising:
    a processor; and
    a memory communicatively coupled to the processor, wherein the processor and the memory are configured to perform the operations of:
        receiving a circuit design that includes a plurality of cells and interconnects;
        determining delta geometry information for the circuit design;
        calculating incremental timing differences for the circuit design using the determined delta geometry information; and
        evaluating the incremental timing differences against a timing budget to determine slack time in the circuit design; and
        generating dimensional variation rules for the circuit design based on the determined slack time.

26. The computing system of claim 25, further comprising partitioning the calculated incremental timing differences among the plurality of cells and interconnects of the circuit design.

27. The computing system of claim 26, further comprising allocating the timing budget among the plurality of the cells and interconnects of the circuit design.

28. The computing system of claim 27, wherein allocating the timing budget includes allocating difference information relating to IC characterization parameters.

29. The computing system of claim 26, further comprising partitioning the slack time indicated by the incremental timing differences among a plurality of the cells and interconnects.

30. The computing system of claim 29, further comprising generating a timing variation database that includes maximum and minimum timing variations associated with the partitioned slack time for the cells and interconnects.

31. The computing system of 30, further comprising deriving delta information for a cell from timing variations corresponding to that cell.

32. The computing system of claim 25, wherein evaluating the incremental timing differences comprises generating a max/min timing variation database of incremental timing differences, and generating delta characterization information for a cell from timing variations corresponding to each of a plurality of interconnects.

33. The computing system of claim 25, further comprising generating a report of a source of differences in the circuit design that result in violation of the timing budget.

34. The computing system of claim 25, wherein generating dimensional variation rules for the circuit design comprises performing shape slack budgeting based on the delta geometry information and the timing budget.

35. The computing system of claim 25, further comprising generating a delta budgetary assignment corresponding to the cells or interconnects of the circuit design.

36. The computing system of claim 25, wherein delta geometry information includes at least one of length, width and thickness variation information associated with elements of the circuit design.

37. A system for characterizing a circuit design using delta information corresponding to characterization parameters of the circuit design, comprising:
- means for receiving a circuit design that includes a plurality of cells and interconnects;
- means for determining delta geometry information for the circuit design;
- means for calculating incremental timing differences for the circuit design using the determined delta geometry information; and
- means for evaluating the incremental timing differences against a timing budget to determine slack time in the circuit design; and
- means for generating dimensional variation rules for the circuit design based on the determined slack time.

* * * * *